(12) United States Patent
Aoyama

(10) Patent No.: US 7,265,428 B2
(45) Date of Patent: Sep. 4, 2007

(54) SEMICONDUCTOR DEVICE HAVING NMOSFET AND PMOSFET AND MANUFACTURING METHOD THEREOF

(75) Inventor: Tomonori Aoyama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 61 days.

(21) Appl. No.: 11/016,923

(22) Filed: Dec. 21, 2004

(65) Prior Publication Data
US 2005/0199963 A1 Sep. 15, 2005

(30) Foreign Application Priority Data
Mar. 12, 2004 (JP) ............... 2004-071138

(51) Int. Cl.
*H01L 29/76* (2006.01)
(52) U.S. Cl. ............ 257/413; 257/371; 257/369; 257/377; 257/412
(58) Field of Classification Search ........ 257/371, 257/369, 377, 384, 388, 412, 413, 755
See application file for complete search history.

(56) References Cited

U.S. PATENT DOCUMENTS

| 6,291,282 B1 | 9/2001 | Wilk et al. |
| 6,573,134 B2 | 6/2003 | Ma et al. |
| 2003/0143825 A1 | 7/2003 | Matsuo et al. |

FOREIGN PATENT DOCUMENTS

| JP | 2000-252371 | 9/2000 |
| JP | 2003-045995 | 2/2003 |
| JP | 2003-258121 | 9/2003 |
| JP | 2003-303963 | 10/2003 |

OTHER PUBLICATIONS

Chatterjee et al.; "Sub-100mn Gate Length Metal Gate MNOS Transistors Fabricated by a Replacement Gate Process", 1997 IEEE; p. 821.
Yagashita et al.; "High Performance Metal Gate MOSFETs Fabricated by CMP for 0.1 μm Regime", 1993 IEEE; pp. 29.3.1-29.3.4.
Krivokapic et al.; "Nickel Silicide Metal Gate FDSOI Devices with Improved Gate Oxide Leakage", 2002 IEEE, pp. 271.
Maszara et al.; "Transistors with Dual Work Function Metal Gates by Single Full Silicidation (FUSI) of Polysilicon Gates", 2002 IEEE, pp. 367.
Aoyama et al., "In-Situ HfSiON/SiO2 Gate Dielectric Fabrication Using Hot Wall Batch System", IWGI 2003, Tokyo; pp. 174-179.

*Primary Examiner*—Evan Pert
*Assistant Examiner*—Tan Tran
(74) *Attorney, Agent, or Firm*—Finnegan, Henderson, Farabow, Garrett & Dunner, L.L.P.

(57) ABSTRACT

An element isolation dielectric film is formed around device regions in a silicon substrate. The device regions are an n-type diffusion region, a p-type diffusion region, a p-type extension region, an n-type extension region, a p-type source/drain region, an n-type source/drain region, and a nickel silicide film. Each gate dielectric film includes a silicon oxide film and a hafnium silicate nitride film. The n-type gate electrode includes an n-type silicon film and a nickel silicide film, and the p-type gate electrode includes a nickel silicide film. The hafnium silicate nitride films are not on the sidewalls of the gate electrodes.

7 Claims, 39 Drawing Sheets

Prior Art

*Prior Art*

*Prior Art*

*Prior Art*

Prior Art

Prior Art

Prior Art

Ion Implantation

*Prior Art*

*Prior Art*

Prior Art

US 7,265,428 B2

SEMICONDUCTOR DEVICE HAVING NMOSFET AND PMOSFET AND MANUFACTURING METHOD THEREOF

BACKGROUND OF THE INVENTION

1. Field of the Invention

The present invention relates to a semiconductor device and a manufacturing method therefor, and more particularly to a semiconductor device including a CMOSFET made up of an NMOSFET and a PMOSFET formed on a silicon substrate, and a manufacturing method therefor.

2. Background Art

In recent years, the integration density of semiconductor integrated circuit devices has considerably increased. As such, devices such as transistors in MOS (Metal Oxide Semiconductor) devices have been miniaturized and enhanced in performance. Especially, gate dielectric films, which are a component of the MOS structure, have become thinner and thinner to accommodate the miniaturization, high-speed operation, and lower-voltage operation of the transistors.

Conventionally, a silicon oxide ($SiO_2$) film or a silicon oxynitride (SiON) film is used as a gate dielectric film. However, reducing the film thickness of a gate dielectric film formed of such a material increases the leakage current.

On the other hand, the sub-0.1 µm generation CMOS (Complementary Metal Oxide Semiconductor) devices must employ gate dielectric films having an equivalent oxide thickness of 1.5 nm or less. Therefore, it is proposed that metal oxide films or metal silicate films, which have a high relative permittivity, may be used as the gate dielectric films to provide an increased film thickness and thereby reduce the leakage current.

A description will be given below of a conventional method for manufacturing a semiconductor device using high dielectric constant films as its gate dielectric films.

First of all, as shown in FIG. 30A, a silicon oxide film is buried in predetermined regions of a silicon substrate 301 to form device isolation regions 302 having an STI (Shallow Trench Isolation) structure and a sacrificial oxide film 303.

Then, as shown in FIG. 30B, P (phosphorus) is ion-implanted in the silicon substrate 301 using a resist 304 as a mask. The P implantation is repeated a plurality of times to form a diffusion layer and adjust the transistor threshold voltage. After the above P implantation process, the resist 304 is removed. Then, B (boron) is implanted in the silicon substrate 301 in the same manner as described above using another resist (now shown) as a mask. After removing the resist, a heat treatment is carried out to diffuse the impurities, forming an n-type diffusion layer 306 and a p-type diffusion layer 307, as shown in FIG. 30C.

After forming the diffusion layers, the sacrificial oxide film 303 is removed using an aqueous solution of $NH_4F$. Then, a thin silicon oxide film 308 is formed on the surface of the silicon substrate 301, and a hafnium silicon oxynitride film 309 is formed on the silicon oxide film 308, as shown in FIG. 31A. Specifically, the hafnium silicon oxynitride film 309 may be formed by forming a hafnium silicide film on the silicon oxide film 308 and then heat-treating the substrate in an atmosphere of $NH_3$ or $N_2$ plasma.

Then, after forming an amorphous silicon film 3010 by a CVD (Chemical Vapor Deposition) technique, P is ion-implanted using a resist 3011 as a mask to form an n-type gate electrode, as shown in FIG. 31B. It should be noted that a polysilicon film may be formed instead of the amorphous silicon film 3010.

After removing the resist 3011, B (boron) ions are implanted in the amorphous silicon film 3010 in the same manner as described above using another resist (not shown) as a mask to form a p-type electrode. After removing the resist, a silicon oxide film 3013 is formed on the entire surface and processed using a resist 3014 as a mask, as shown in FIG. 31C. In FIG. 31C, reference numerals 3010a and 3010b denote the resultant n-type and p-type amorphous silicon films, respectively.

Then, as shown in FIG. 32A, after removing the resist 3014, the n-type amorphous silicon 3010a and the p-type amorphous silicon film 3010b are processed to form gate electrodes. After that, the hafnium silicon oxynitride film 309 and silicon oxide film 308 are etched using the silicon oxide film 3013 as a hard mask such that portions of the gate dielectric film (made up of the hafnium silicon oxynitride film 309 and silicon oxide film 308) other than those under the gate electrodes are removed, as shown in FIG. 32B. It should be noted that the silicon oxide film 3013 is also etched off (or removed by etching) at that time.

After that, the sides of the gate electrodes 3010a and 3010b are slightly oxidized at a temperature between 900° C. and 1,000° C. in an atmosphere containing a concentration of oxygen between 0.05% and 1%, and then a silicon oxide film 3015 is deposited on the entire surface, as shown in FIG. 32C.

Then, B is ion-implanted in the n-type diffusion layer 306 using a resist 3016 and the gate electrode 3010b as masks, as shown in FIG. 33A. After that, P is ion-implanted in the p-type diffusion layer 307 in the same manner. This forms a p-type extension region 3018 and an n-type extension region 3019, as shown in FIG. 33B.

Then, as shown in FIG. 33C, a silicon nitride film 3020 is formed on the entire surface by a CVD technique. After that, reactive ion etching is carried out to remove portions of the silicon oxide film 3015 and the silicon nitride film 3020 other than those on the sides of the gate electrodes 3010a and 3010b.

Then, as shown in FIG. 34A, B is ion-implanted in the n-type diffusion layer 306 using as masks a resist 3021 and the gate electrode 3010b (with the sidewalls formed of remaining portions of the silicon oxide film 3015 and the silicon nitride film 3020). After removing the resist 3021, P is ion-implanted in the p-type diffusion layer 307 in the same manner. Then, a heat treatment is carried out at a temperature between 900° C. and 1,100° C. to activate the impurities, forming a p-type source/drain diffusion layer 3023 and an n-type source/drain diffusion layer 3024, as shown in FIG. 34B.

Then, a nickel film (not shown) and a titanium nitride film (not shown) are formed on the entire surface, and a heat treatment is carried out. After that, the titanium nitride film and the unreacted portion of the nickel film are etched off (removed by etching) so as to selectively form a nickel silicide film 3025 only on the source/drain diffusion layers 3023 and 3024 and the silicon gate electrodes 3010a and 3010b, as shown in FIG. 34C.

Then, an interlayer insulating film 3029 is formed and planarized by a CMP (Chemical Mechanical Polishing) technique, as shown in FIG. 35. After that, contacts, wiring, etc. are formed.

However, analysis of the characteristics of transistors formed by the above conventional method indicates that, whereas the NMOSFET (N-Channel Metal Oxide Semiconductor Field Effect Transistor) has an appropriate threshold voltage value, the PMOSFET (P-Channel Metal Oxide Semiconductor Field Effect Transistor) has its threshold voltage considerably shifted toward the negative side. Furthermore, the PMOSFET has a smaller inversion capacitance than the NMOSFET, making it impossible to ensure a desired drain current level (see, e.g., T. Aoyama et al., International Workshop on Gate Insulator, 2003, p. 174).

To prevent the threshold voltage from being shifted and to obtain a large inversion capacitance, attempts have been made to use metal, metal nitride, metal silicate, etc. for gate electrodes, instead of silicon. Different metals have different work functions. Therefore, since the threshold voltage of a transistor changes with the work function of the gate electrode, a metal having an optimum work function may be used for the gate electrode to control the threshold voltage (or optimize the threshold voltage). Further, a metal electrode is less likely to be depleted than a silicon electrode, allowing a large inversion capacitance to be obtained.

However, since metal electrodes have poor heat resistance as compared to silicon electrodes, it is not possible to form a transistor with metal electrodes using the above conventional process. That is, since the above method forms source/drain diffusion layers after forming gate electrodes, a heat treatment must be subsequently performed at approximately 1,000° C. to activate the impurities. Such a heat process changes the shape of the metal electrodes and causes impurities to diffuse into the gate dielectric films, etc. To overcome these problems, methods have been proposed which form source/drain diffusion layers before forming gate electrodes (see, e.g., A. Chatterjee et al., International Electron Devices Meeting (IEDM), 1997, p. 821; A. Yagishita et al., International Electron Devices Meeting (IEDM), 1998, p. 785).

One of these methods will be described below. It should be noted that the gate electrodes of the NMOSFET and the PMOSFET are assumed to be formed of the same type of metal film, for simplicity.

First, after forming device isolation regions 402 and a sacrificial oxide film 403 in a silicon substrate 401, P (phosphorus) and B (boron) are implanted in the substrate sequentially and then a heat treatment is carried to form an n-type diffusion layer 406 and a p-type diffusion layer 407, as in the steps shown in FIGS. 30A to 30C. After that, an amorphous silicon film 4010 is formed on the sacrificial oxide film 403 by a CVD technique, producing the structure shown in FIG. 36A. It should be noted that a polysilicon film may be formed instead of the amorphous silicon film 4010.

Then, a silicon oxide film 4013 is formed on the entire surface and processed using a resist 4014 as a mask, as shown in FIG. 36B. After removing the resist 4014, the amorphous silicon film 4010 is processed using the silicon oxide film 4013 as a mask, forming gate electrodes, as shown in FIG. 36C.

Then, the sides of the gate electrodes 4010 are slightly oxidized at a temperature between 900° C. and 1,000° C. in an atmosphere containing a concentration of oxygen between 0.05% and 1%, and a silicon oxide film 4015 is deposited on the entire surface. After that, B and P are ion-implanted in the n-type diffusion layer 406 and the p-type diffusion layer 407, respectively, using resists (not shown) and the gate electrodes 4010 as masks to form a p-type extension region 4018 and an n-type extension region 4019, as shown in FIG. 37A.

Then, after forming a silicon nitride film 4020 on the entire surface by a CVD technique, reactive ion etching is carried out to remove portions of the silicon oxide film 4015 and the silicon nitride film 4020 other than those on the sides of the gate electrodes 4010. After that, B is ion-implanted in the n-type diffusion layer 406 using as masks a resist 4021 and the (PMOS) gate electrode 4010 (with a silicon oxide film 4013 thereon and with the sidewalls formed of remaining portions of the silicon oxide film 4015 and the silicon nitride film 4020), as shown in FIG. 37B.

After removing the resist 4021, P is ion-implanted in the p-type diffusion layer 407 in the same manner. Then, a heat treatment is carried out at a temperature between 900° C. and 1,100° C. to activate the impurities, forming a p-type source/drain diffusion layer 4023 and an n-type source/drain diffusion layer 4024, as shown in FIG. 37C.

Then, portions of the sacrificial oxide film 403 other than those under the gate electrodes 4010 are removed using an aqueous solution of dilute hydrofluoric acid or $NH_4F$. Then, a heat treatment is carried out after forming a nickel film and a titanium nitride film on the entire surface. After that, the titanium nitride film and the unreacted portion of the nickel film are etched off so as to selectively form a nickel silicide film 4025 only on the source/drain diffusion layers 4023 and 4024, as shown in FIG. 38A.

Then, an interlayer insulating film 4026 is formed by a CVD technique or a coating technique and polished by a CMP technique until the amorphous silicon films 4010 are exposed. After that, the exposed amorphous silicon films 4010 are removed by reactive ion etching, as shown in FIG. 38B.

Then, after removing the exposed sacrificial oxide film 403, a thin silicon oxide film 408 is formed on the surface of the silicon substrate 401, and then a hafnium silicate film 409 is formed on the entire surface as a high dielectric constant insulating film, as shown in FIG. 38C.

Then, a titanium nitride film 4030 and a tungsten film 4031 are deposited, and portions of the titanium film 4030 and the tungsten film 4031 other than those in the gate electrode portions (that is, the portions of the titanium 4030 and the tungsten film 4031 above the interlayer insulating film 4026) are removed by a CMP technique. Then, after removing the portion of the hafnium silicate film 409 on the interlayer insulating film 4026, an interlayer insulating film 4029 is deposited and planarized, as shown in FIG. 39. After that, contacts, wiring, etc. are formed.

However, if the gate electrodes of the NMOSFET and the PMOSFET are formed of the same type of metal film, the threshold voltage of one of the FETs cannot be set to an appropriate value. For example, assume that the electrodes are formed of a titanium nitride film, whose Fermi level lies close to the middle of the bandgap of silicon, and used with a high dielectric constant insulating film, as in the above example. In such a case, even though the PMOSFET has a threshold voltage value close to an appropriate value, the NMOSFET has its threshold voltage shifted toward the positive side, as compared to when silicon electrodes are used (see FIG. 29B). This problem arises not only with NMOS gate electrodes formed of a titanium nitride film but also with NMOS gate electrodes of other materials whose Fermi level lies close to the middle of the bandgap of silicon, such as nickel silicide and cobalt silicide, when these electrodes are used with a high dielectric constant insulating film. It should be noted that the above problem does not occur when gate electrodes of nickel silicide are used with a gate dielectric film formed of a silicon oxide film (see, e.g., W. P. Maszara et al., International Electron Devices Meeting (IEDM), 2002, p. 367; Z. Krivokapic et al., International Electron Devices Meeting (IEDM), 2002, p. 271). This means that this problem is considered to occur only when a high dielectric constant insulating film is used as a gate dielectric film.

To overcome the above problem, attempts have been made to employ a configuration in which the NMOSFET and the PMOSFET include metal gate electrodes having different work functions (see, e.g., Japanese Laid-Open Patent Publications Nos. 2000-252371, 2003-258121, and 2003-45995). Such an arrangement is expected to provide appropriate threshold voltage values and large inversion capacitances. However, since the metal electrodes of the NMOSFET and the PMOSFET are formed separately from each other, a larger number of manufacturing steps must be performed, resulting in increased cost. Further, the above conventional method forms the nickel silicide 4025 on the source/drain diffusion layers 4023 and 4024 before forming the gate dielectric films. In such a case, however, when the gate dielectric films are formed, the temperature must be maintained below 600° C., considering the aggregation resistance of nickel silicide. Thus, the heat process for the gate dielectric films must be performed at less than 600° C., making it difficult to improve the film quality of the gate dielectric films.

To avoid this problem, instead of the sacrificial oxide film 403, a high dielectric constant gate dielectric film, etc. may be formed beforehand. In such a case, sufficient heat treatment can be carried out when forming the gate dielectric films. However, when the silicon electrodes 4010, which are dummy gate electrodes, are etched off, the gate dielectric films may be damaged or removed together with silicon electrodes 4010.

The problems with the conventional techniques are summarized as follows.

If the gate dielectric films are formed of a high dielectric constant film and used with silicon electrodes, the threshold voltage of the PMOSFET shifts toward the negative side and the inversion capacitance is small.

Metal electrodes may be used to solve the above problems. Such an arrangement provides large inversion capacitances. However, it is necessary to form metal electrodes having work functions optimum for the NMOSFET and the PMOSFET, respectively. This means that these metal electrodes must be formed in separate steps, increasing the total number of manufacturing steps and hence increasing the cost. Furthermore, the source/drain diffusion layers must be formed before forming the (metal) gate electrodes, considering the heat resistance of the metal electrodes. However, since silicide formed on the surfaces of the source/drain diffusion layers has a low heat resistance, the substrate cannot be heat-treated at a high temperature when forming the gate dielectric films, making it difficult to improve the film quality of the gate dielectric films.

To avoid these problems, the gate dielectric films may be formed before forming the source/drain diffusion layers and the silicide on these layers. This method, however, is disadvantageous in that the gate dielectric films are damaged when the silicon electrodes, which are the dummy gate electrodes, are etched off. In this case, it might happen that the gate dielectric films themselves are etched.

SUMMARY OF THE INVENTION

The present invention has been devised in view of the above problems. It is, therefore, an object of the present invention to provide a semiconductor device having a gate electrode structure which enables both the NMOSFET and the PMOSFET to have appropriate threshold voltage values and large inversion capacitances, and a manufacturing method therefor.

According to one aspect of the present invention, a semiconductor device comprises a silicon substrate, and a CMOSFET formed on the silicon substrate and made up of an NMOSFET and a PMOSFET. A gate dielectric film of the NMOSFET and a gate dielectric film of the PMOSFET each have a laminated structure including a first insulating film and a second insulating film. The first insulating film is formed on the silicon substrate, the second insulating film is formed on the first insulating film. A gate electrode of the NMOSFET includes an n-type silicon film and a first metal silicide film. The n-type silicon film is formed on the gate dielectric film of the NMOSFET, and the first metal silicide film is formed on the n-type silicon film. A gate electrode of the PMOSFET includes a second metal silicide film formed on the gate dielectric film of the PMOSFET. The second insulating film is a high dielectric constant insulating film and is not formed on sidewalls of the gate electrodes of the NMOSFET and the PMOSFET.

According to another aspect of the present invention, a semiconductor device comprises a silicon substrate, and a CMOSFET formed on the silicon substrate and made up of an NMOSFET and a PMOSFET. A gate dielectric film of the NMOSFET and a gate dielectric film of the PMOSFET each have a laminated structure including a first insulating film and a second insulating film. The first insulating film is formed on the silicon substrate, and the second insulating film is formed on the first insulating film. A gate electrode of the NMOSFET includes an n-type silicon film and a first metal silicide film. The n-type silicon film is formed on the gate dielectric film of the NMOSFET, and the first metal silicide film is formed on the n-type silicon film. A gate electrode of the PMOSFET has a laminated structure including a metal film and a second metal silicide film. The metal film is formed on the gate dielectric film of the PMOSFET, and the second metal silicide film is formed on the metal film. The second insulating film is a high dielectric constant insulating film, and is not formed on sidewalls of the gate electrodes of the NMOSFET and the PMOSFET.

According to other aspect of the present invention, in a method for manufacturing a semiconductor device including a CMOSFET made up of an NMOSFET and a PMOSFET, a gate dielectric film is formed on a silicon substrate in which are provided a element isolation insulating film, an n-type diffusion layer region, and a p-type diffusion layer region. The gate dielectric film includes a high dielectric constant insulating film. A silicon film is formed on the gate dielectric film. N-type impurities is implanted in the portion of the silicon film in an NMOSFET region for the NMOSFET, The silicon film is processed to form an n-type silicon film pattern and an undoped silicon film pattern each having a gate electrode shape. Portions of the gate dielectric film other than those under the n-type silicon film pattern and the undoped silicon film pattern are removed. After the step of removing the portions of the gate dielectric film, a first sidewall insulating film is formed on the entire surface of the silicon substrate. Impurities are implanted in the silicon substrate using the n-type silicon film pattern and the undoped silicon film pattern as masks to form an n-type extension region and a p-type extension region. A second sidewall insulating film is formed on the first sidewall insulating film. Portions of the first and second sidewall insulating films other than those on sidewalls of the n-type silicon film pattern and the undoped silicon film pattern are removed. Impurities are implanted in the silicon substrate using the n-type silicon film pattern and the undoped silicon film pattern as masks to form an n-type source and an n-type drain regions (an n-type source/drain region) and a p-type source and a p-type drain regions (a p-type source/drain region). The n-type silicon film pattern and the undoped silicon film pattern have the first and second sidewall insulating films on the sidewalls. A first metal silicide film is formed on the n-type source/drain region and the p-type source/drain region. After the step of forming the first metal silicide film, an interlayer insulating film is formed on the silicon substrate such that the n-type silicon film pattern and the undoped silicon film pattern are buried under the interlayer insulating film. The interlayer insulating film is processed so as to expose surfaces of the n-type silicon film pattern and the undoped silicon film pattern. The undoped silicon film pattern is etched to a predetermined film thickness. A metal film is formed on the entire surface of the silicon substrate. A heat treatment is performed so as to transform an upper portion of the n-type silicon film pattern and all portions of the undoped silicon film pattern into second metal silicide films formed of a silicide of the metal film.

According to other aspect of the present invention, in a method for manufacturing a semiconductor device includes a CMOSFET made up of an NMOSFET and a PMOSFET, a gate dielectric film is formed on a silicon substrate in which are provided a element isolation insulating film, an n-type diffusion layer region, and a p-type diffusion layer region. The gate dielectric film includes a high dielectric constant insulating film. A silicon film is formed on the gate dielectric film. N-type impurities are implanted in the portion of the silicon film in an NMOSFET region for the NMOSFET. The silicon film is processed to form an n-type silicon film pattern and an undoped silicon film pattern each having a gate electrode shape. Portions of the gate dielectric film other than those under the n-type silicon film pattern and the undoped silicon film pattern are removed. After the step of removing the portions of the gate dielectric film, a first sidewall insulating film is formed on the entire surface of the silicon substrate. Impurities are implanted in the silicon substrate using the n-type silicon film pattern and the undoped silicon film pattern as masks to form an n-type extension region and a p-type extension region. A second sidewall insulating film is formed on the first sidewall insulating film. Portions of the first and second sidewall insulating films other than those on sidewalls of the n-type silicon film pattern and the undoped silicon film pattern are removed. Impurities are implanted in the silicon substrate using the n-type silicon film pattern and the undoped silicon film pattern as masks to form an n-type source/drain region and a p-type source/drain region. The n-type silicon film pattern and the undoped silicon film pattern have the first and second sidewall insulating films on the sidewalls. A first metal silicide film is formed on the n-type source/drain region and the p-type source/drain region. After the step of forming the first metal silicide film, an interlayer insulating film is formed on the silicon substrate such that the n-type silicon film pattern and the undoped silicon film pattern are buried under the interlayer insulating film. The interlayer insulating film is processed so as to expose surfaces of the n-type silicon film pattern and the undoped silicon film pattern. A first metal film is formed on the entire surface of the silicon substrate. A heat treatment is performed so as to transform an upper portion of the n-type silicon film pattern and an upper portion of the undoped silicon film pattern into second metal silicide films formed of a silicide of the first metal film. The second metal silicide film on the undoped silicon film pattern is removed. A second metal film and a third metal film are sequentially formed on the undoped silicon film pattern. A heat treatment is performed so as to cause the undoped silicon film pattern, and the second and third metal films to react with one another, and thereby form a laminated structure on the gate dielectric film. The laminated structure is made up of the second metal film and a third metal silicide film laminated onto the second metal film. The third metal silicide film is formed of a silicide of the third metal film.

According to other aspect of the present invention, in a method for manufacturing a semiconductor device includes a CMOSFET made up of an NMOSFET and a PMOSFET, a gate dielectric film is formed on a silicon substrate in which are provided a element isolation insulating film, an n-type diffusion layer region, and a p-type diffusion layer region. The gate dielectric film includes a high dielectric constant insulating film. A silicon film is formed on the gate dielectric film. N-type impurities are implanted in the portion of the silicon film in an NMOSFET region for the NMOSFET. The silicon film is processed to form an n-type silicon film pattern and an undoped silicon film pattern each having a gate electrode shape. Portions of the gate dielectric film other than those under the n-type silicon film pattern and the undoped silicon film pattern are removed. After the step of removing the portions of the gate dielectric film, a first sidewall insulating film is formed on the entire surface of the silicon substrate. Impurities are implanted in the silicon substrate using the n-type silicon film pattern and the undoped silicon film pattern as masks to form an n-type extension region and a p-type extension region. A second sidewall insulating film is formed on the first sidewall insulating film. Portions of the first and second sidewall insulating films other than those on sidewalls of the n-type silicon film pattern and the undoped silicon film pattern are removed. Impurities are implanted in the silicon substrate using the n-type silicon film pattern and the undoped silicon film pattern as masks to form an n-type source/drain region and a p-type source/drain region. The n-type silicon film pattern and the undoped silicon film pattern have the first and second sidewall insulating films on the sidewalls. A first metal silicide film is formed on the n-type source/drain region and the p-type source/drain region. After the step of forming the first metal silicide film, an interlayer insulating film is formed on the silicon substrate such that the n-type silicon film pattern and the undoped silicon film pattern are buried under the interlayer insulating film. The interlayer insulating film is processed so as to expose surfaces of the n-type silicon film pattern and the undoped silicon film pattern. A first metal film is formed on the entire surface of the silicon substrate. A heat treatment is performed so as to transform an upper portion of the n-type silicon film pattern and an upper portion of the undoped silicon film pattern into second metal silicide films formed of a silicide of the first metal film. A second metal film is formed on the second metal silicide film in a PMOSFET region for the PMOSFET. A heat treatment is performed so as to cause the undoped silicon film pattern, the second metal silicide film, and the second metal film to react with one another, and thereby form a laminated structure on the gate dielectric film. The laminated structure is made up of the second metal silicide film and a third metal silicide film laminated onto the second metal silicide film. The third metal silicide film is formed of a silicide of the second metal film.

According to other aspect of the present invention, in a method for manufacturing a semiconductor device includes a CMOSFET made up of an NMOSFET and a PMOSFET, a gate dielectric film is formed on a silicon substrate in which are provided a element isolation insulating film, an n-type diffusion layer region, and a p-type diffusion layer region. The gate dielectric film includes a high dielectric constant insulating film. A silicon film is formed on the gate dielectric film. N-type impurities are implanted in the portion of the silicon film in an NMOSFET region for the NMOSFET. The silicon film is processed to form an n-type silicon film pattern and an undoped silicon film pattern each having a gate electrode shape. Portions of the gate dielectric film other than those under the n-type silicon film pattern and the undoped silicon film pattern are removed. After the step of removing the portions of the gate dielectric film, a first sidewall insulating film is formed on the entire surface of the silicon substrate. Impurities are implanted in the silicon substrate using the n-type silicon film pattern and the undoped silicon film pattern as masks to form an n-type extension region and a p-type extension region. A second sidewall insulating film is formed on the first sidewall insulating film. Portions of the first and second sidewall insulating films other than those on sidewalls of the n-type silicon film pattern and the undoped silicon film pattern are removed. Impurities are implanted in the silicon substrate using the n-type silicon film pattern and the undoped silicon film pattern as masks to form an n-type source/drain region and a p-type source/drain region. The n-type silicon film pattern and the undoped silicon film pattern have the first and second sidewall insulating films on the sidewalls. A first metal silicide film is formed on the n-type source/drain region and the p-type source/drain region. After the step of forming the first metal silicide film, an interlayer insulating film is formed on the silicon substrate such that the n-type silicon film pattern and the undoped silicon film pattern are buried under the interlayer insulating film. The interlayer insulating film is processed so as to expose surfaces of the n-type silicon film pattern and the undoped silicon film pattern. A first metal film is formed on the entire surface of the silicon substrate. A heat treatment is performed so as to transform an upper portion of the n-type silicon film pattern and an upper portion of the undoped silicon film pattern into second metal silicide films formed of a silicide of the first metal film. Another first metal film is formed on the second metal silicide film in a PMOSFET region for the PMOSFET. A heat treatment is performed so as to cause the undoped silicon film pattern, the second metal silicide film, and the another first metal film to react with one another, and thereby produce a structure in which the second metal silicide film is formed on the gate dielectric film.

According to other aspect of the present invention, in a method for manufacturing a semiconductor device includes a CMOSFET made up of an NMOSFET and a PMOSFET, a gate dielectric film is formed on a silicon substrate in which are provided a element isolation insulating film, an n-type diffusion layer region, and a p-type diffusion layer region. The gate dielectric film includes a high dielectric constant insulating film. A silicon film is formed on the gate dielectric film. N-type impurities are implanted in the portion of the silicon film in an NMOSFET region for the NMOSFET. The silicon film is processed to form an n-type silicon film pattern and an undoped silicon film pattern each having a gate electrode shape. Portions of the gate dielectric film other than those under the n-type silicon film pattern and the undoped silicon film pattern are removed. After the step of removing the portions of the gate dielectric film, a first sidewall insulating film is formed on the entire surface of the silicon substrate. Impurities are implanted in the silicon substrate using the n-type silicon film pattern and the undoped silicon film pattern as masks to form an n-type extension region and a p-type extension region. A second sidewall insulating film is formed on the first sidewall insulating film. Portions of the first and second sidewall insulating films other than those on sidewalls of the n-type silicon film pattern and the undoped silicon film pattern are removed. Impurities are implanted in the silicon substrate using the n-type silicon film pattern and the undoped silicon film pattern as masks to form an n-type source/drain region and a p-type source/drain region. The n-type silicon film pattern and the undoped silicon film pattern have the first and second sidewall insulating films on the sidewalls. A first metal silicide film is formed on the n-type source/drain region and the p-type source/drain region. After the step of forming the first metal silicide film, an interlayer insulating film is formed on the silicon substrate such that the n-type silicon film pattern and the undoped silicon film pattern are buried under the interlayer insulating film. The interlayer insulating film is processed so as to expose surfaces of the n-type silicon film pattern and the undoped silicon film pattern. A first metal film is formed on the entire surface of the silicon substrate. A heat treatment is performed so as to transform an upper portion of the n-type silicon film pattern and an upper portion of the undoped silicon film pattern into second metal silicide films formed of a silicide of the first metal film. A second metal film is formed on the second metal silicide film in a PMOSFET region for the PMOSFET. A heat treatment is performed so as to cause the undoped silicon film pattern, the second metal silicide film, and the second metal film to react with one another, and thereby form a laminated structure on the gate dielectric film. The laminated structure is made up of the first metal film and a third metal silicide film laminated onto the first metal film. The third metal silicide film is formed of a silicide of the second metal film.

Other objects and advantages of the present invention will become apparent from the following description.

DETAILED DESCRIPTION OF THE PREFERRED EMBODIMENTS

Figure 1:
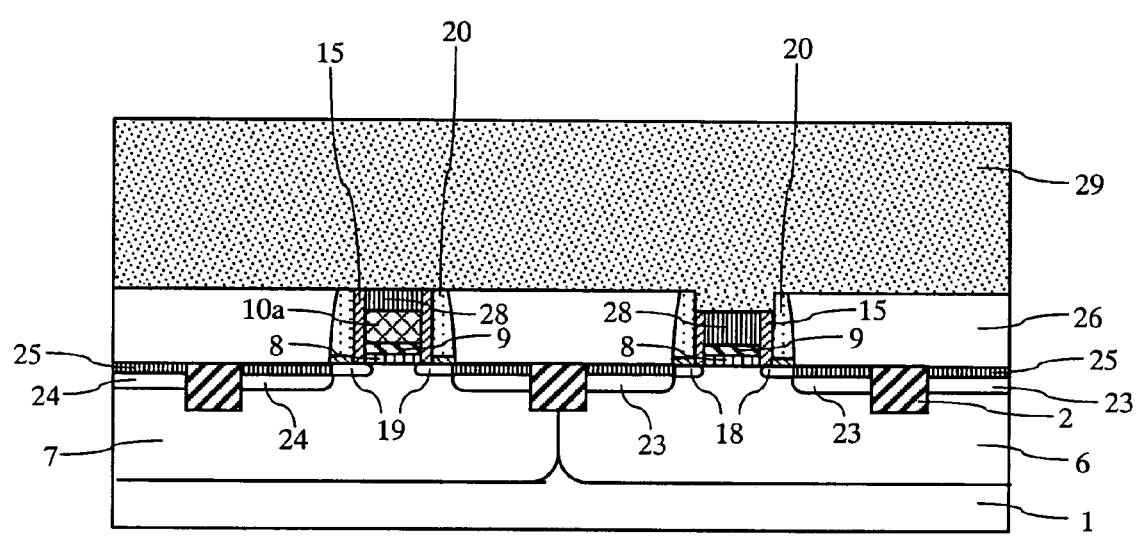
FIG. 1 is a cross-sectional view of a semiconductor device according to a first embodiment of the present invention.

As described above, an object of the present invention is to provide a gate electrode structure which enables the NMOSFET and the PMOSFET to have optimum threshold voltage values and large inversion capacitances, and a manufacturing method therefor.

To accomplish the above object, the present invention uses the following methods.

First, after forming device isolation regions, a gate dielectric film made up of a high dielectric constant insulating film is formed and a necessary heat treatment is performed. Then, a silicon film is deposited and impurities such as P or As are ion-implanted in the portion of the silicon film in the region in which the n-type gate electrode is to be formed. Then, the gate electrodes are formed and processed and portions of the gate dielectric film other than those under the gate electrodes are removed. After forming the gate sidewalls and source/drain regions, silicide of Ni, Co, etc. is formed on the surfaces of the source/drain regions in a self-aligned manner. Then, an interlayer insulating film is deposited on the entire surface and processed by a CMP technique such that the surfaces of the silicon electrodes are exposed. After that, the region in which the n-type gate electrode is formed is masked by, for example, a resist or an SiN film, and the surface of the dummy silicon gate electrode in the region in which the p-type gate electrode is formed is etched such that the dummy silicon gate electrode becomes thin and its surface is set back from the neighboring surfaces. After removing the mask (the resist or SiN film), the material Ni, Co, etc. is caused to react with the silicon electrodes in a self-aligned manner, forming a silicide (a salicide process). At that time, the film thickness of the Ni, Co, etc. is adjusted such that it is equal to or larger than 54% of the film thickness of the remaining p-type dummy silicon gate and smaller than 54% of the film thickness of the n-type silicon electrode. As a result, in the n-type gate electrode region the gate dielectric film is in contact with the n-type silicon electrode, while in the p-type gate electrode region the gate dielectric film is in contact with the Ni silicide or Co silicide.

Methods for reducing the dummy silicon gate electrode in the p-type gate electrode region such that its surface is set back from the neighboring surfaces include reactive ion etching and a method of forming a silicide of Ti, etc, in a self-aligned manner and etching off this silicide. Further, the silicide of Ni, Co, etc. may be brought into contact with the gate dielectric film in the p-type gate electrode region by a silicon replacement technique, instead of by etching the dummy silicon electrode such that its surface is set back. Specifically, for example, after masking the n-type gate electrode region, an Ni film (or Co film), a Ti film, and a TiN film may be sequentially formed and then a heat treatment may be carried out. During the silicide formation, the metal component Ni (or Co) of the Ni silicide (or Co silicide) diffuses into the silicon since these silicides are of the type which contains a metal as a diffusing species. On the other hand, since the Ti silicide is of the type which contains Si as a diffusing species, it absorbs Si from the Ni silicide (or Co silicide) formed thereunder (further forming Ti silicide). Therefore, after the reaction has proceeded, silicide of Ni (or Co) is formed on the gate dielectric film and silicide of Ti is formed on the silicide of Ni (or Co). The TiN film functions as a cap film and prevents the oxidation of the Ti film and degradation of the morphology of the silicide films. Increasing the thickness of the Ti film allows the film to absorb a sufficient amount of Si from the Ni silicide (or Co silicide), which makes it possible to produce a structure in which the metal Ni (or Co) is in contact with the gate dielectric film. Further, instead of Ni or Co, a Pt group metal such as Ru, Rh, Ir, Pd, or Pt may be used in the same manner since their silicides are of the type which provides a metal as a diffusing species during silicide formation. Thus, this method does not completely remove the dummy silicon electrode in the p-type gate electrode region, thereby reducing the damage to the gate dielectric film and preventing the gate dielectric film from being removed.

The gate electrode structure thus formed is such that in the n-type gate electrode region n$^+$-polysilicon is in contact with the gate dielectric film, while in the p-type gate electrode region a Pt group metal or metal silicide is in contact with the gate dielectric film. This arrangement makes it possible to adjust the threshold voltage of the PMOSFET as well as ensuring a sufficient inversion capacitance.

First Embodiment

FIG. 1 is a cross-sectional view of a semiconductor device according to a first embodiment of the present invention.

Referring to the figure, a element isolation insulating film 2 is formed around the device regions in a silicon substrate 1. Within the device regions are formed an n-type diffusion layer region 6, a p-type diffusion layer region 7, a p-type extension region 18, an n-type extension region 19, a p-type source/drain region 23, an n-type source/drain region 24, and a nickel silicide film 25.

The gate dielectric film formed on each channel is made up of a first insulating film and a second insulating film formed on the first insulating film. The first insulating film is a silicon oxide film 8 acting as an underlying interface layer, while the second insulating film is a hafnium silicon oxynitride film 9, which is a high dielectric constant insulating film.

The n-type gate electrode is made up of an n-type silicon film 10a and a nickel silicide film 28. The p-type gate electrode, on the other hand, is made up of a nickel silicide film 28. A silicon oxide film 15 and a silicon nitride film 20 are formed on the sides of each gate electrode. It should be noted that the hafnium silicon oxynitride films 9 are not formed on the sides of the gate electrodes.

Figure 2:
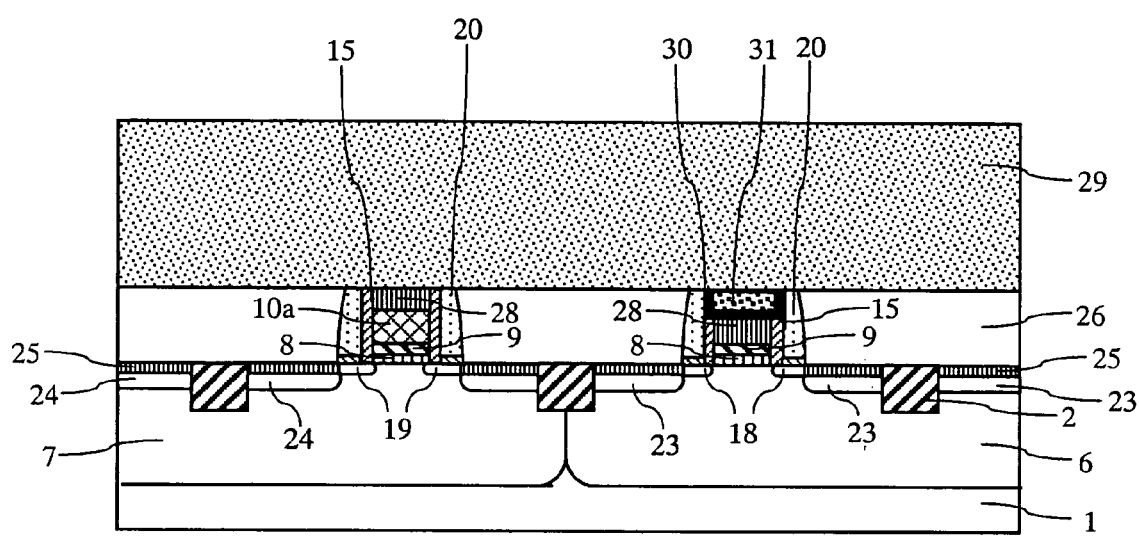
FIG. 2 is a cross-sectional view of another semiconductor device according to the first embodiment.
Figure 3:
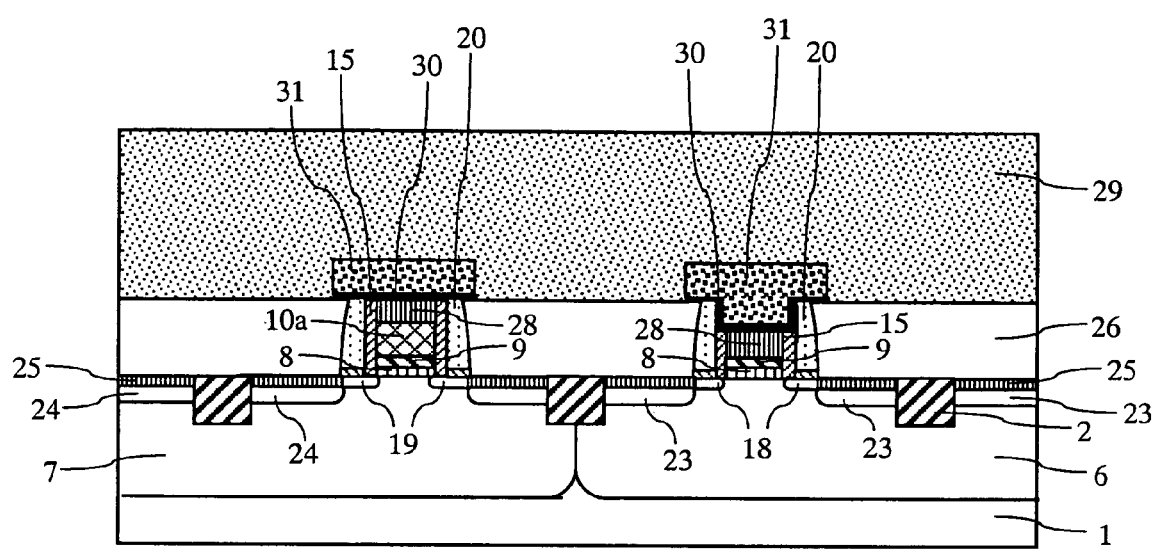
FIG. 3 is a cross-sectional view of still another semiconductor device according to the first embodiment.

FIGS. 2 and 3 show cross-sectional views of other semiconductor devices according to the present embodiment. It should be noted that the components in these figures which are the same as those in FIG. 1 are denoted by like numerals.

The semiconductor device shown in FIG. 2 is different from that shown in FIG. 1 in that the p-type gate electrode is made up of a nickel silicide film 28 and a titanium nitride film 30 and a tungsten film 31 formed above the nickel silicide film 28.

Further, the semiconductor device shown in FIG. 3 is different from that shown in FIG. 2 in that the n-type gate electrode is made up of an n-type silicon film 10a, a nickel silicide film 28, and a titanium nitride film 30 and a tungsten film 31 formed above the n-type silicon film 10a and the nickel silicide film 28. It should be noted that the semiconductor device of FIG. 3 may include a titanium film, etc. formed between the nickel silicide film 28 and the titanium nitride film 30.

Thus, the present embodiment is characterized in that: each gate dielectric film is made up of a silicon oxide film 8 and a hafnium silicon oxynitride film 9; in the n-type gate electrode region, the n-type silicon gate electrode is in contact with the gate dielectric film; in the p-type gate electrode region, a nickel silicide is in contact with the gate dielectric film; and the hafnium silicon oxynitride films 9 are formed only under the n-type and p-type gate electrodes (they are not formed on the sides of the gate electrodes).

It should be noted that even though the above example uses hafnium silicon oxynitride films as the high dielectric constant insulating films, the present invention is not limited to this particular type of high dielectric constant insulating film. Examples of other high dielectric constant insulating films include zirconium silicate nitride films, hafnium silicate films and zirconium silicate films (which do not contain nitrogen), and hafnium oxide films and zirconium oxide films (which do not contain silicon). Further, the high dielectric constant insulating films may be formed of a material containing both hafnium and zirconium.

It should be further noted that even though the above example uses the silicon oxide films 8 as the underlying interface layers, the present invention is not limited to this particular type of interface layer. Silicon oxynitride films or silicon nitride films may be used as the underlying interface layers, instead of the silicon oxide films.

Further, according to the present embodiment, a silicon oxide film or a silicon nitride film may be formed on each high dielectric constant insulating film.

A description will be given below of a method for manufacturing a semiconductor device according to the present embodiment with reference to FIGS. 4 to 9. It should be noted that in these figures, like numerals will be used to denote like components.

Figure 4A:
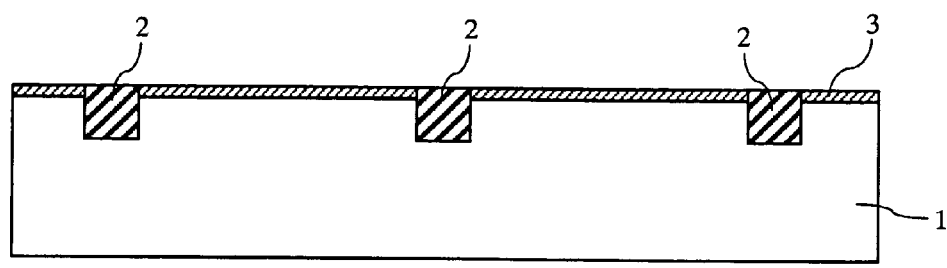
FIGS. 4A to 4C are cross-sectional views illustrating a method for manufacturing a semiconductor device according to the first embodiment.
Figure 4B:
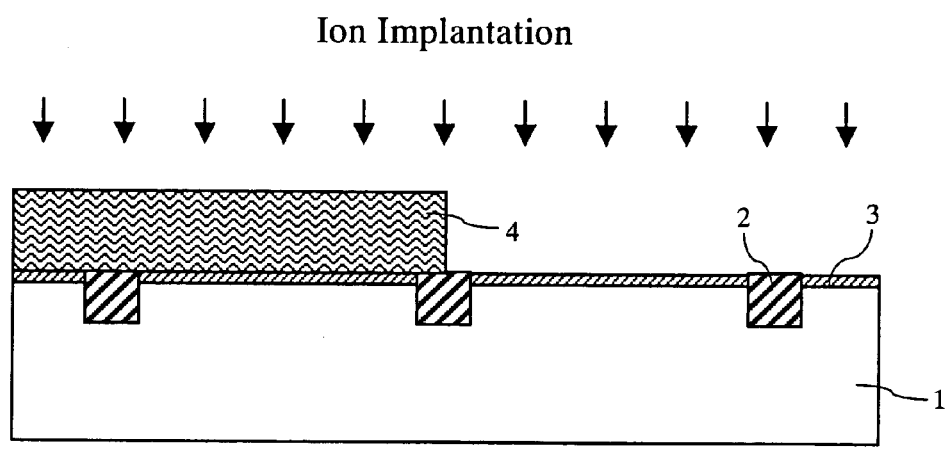
Figure 4C:
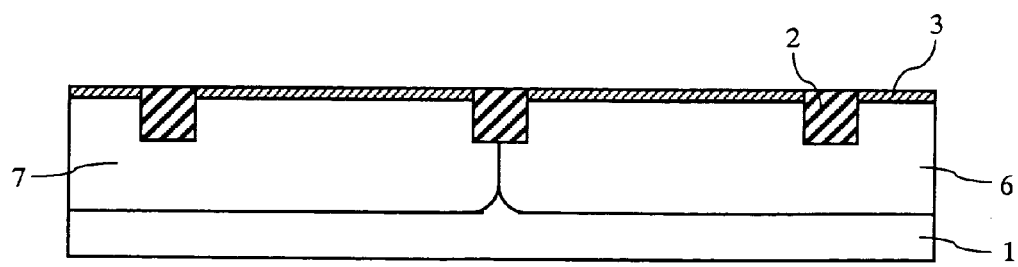

First, as shown in FIG. 4A, a silicon oxide film is buried in predetermined regions of a silicon substrate 1 to form device isolation regions 2 having an STI structure, and a sacrificial oxide film 3. Then, as shown in FIG. 4B, P (phosphorus) is ion-implanted in the silicon substrate 1 using a resist 4 as a mask. The P implantation is repeated a plurality of times to form a diffusion layer and adjust the transistor threshold voltage. It should be noted that in this step, B (boron), In (indium), etc. may be ion-implanted as necessary to adjust the threshold voltage. After the above P implantation process, the resist 4 is removed. Then, B (boron) is implanted in the silicon substrate 1 in the same manner as described above using another resist as a mask. After removing the resist, an n-type diffusion layer 6 and a p-type diffusion layer 7 are formed by heat diffusion (by diffusing the impurities by heat treatment), as shown in FIG. 4C.

Figure 5A:
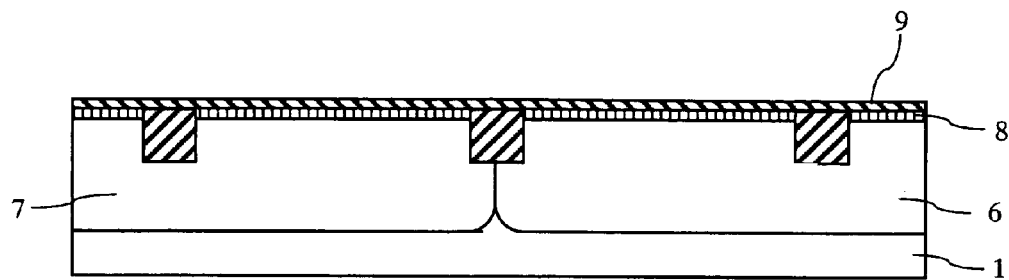
FIGS. 5A to 5C are other cross-sectional views illustrating the method for manufacturing the semiconductor device according to the first embodiment.

Then, the sacrificial oxide film 3 is removed using an aqueous solution of NH$_4$F. After that, the surface is cleaned by use of 0.5% to 5% dilute hydrofluoric acid. Immediately after the cleaning process, a silicon oxide film 8 is formed on the surface of the silicon substrate 1 to a thickness of 0.5 nm, and furthermore a hafnium silicate film 9a is formed on the silicon oxide film 8 to a film thickness of 2.0 nm using tetra-t-butoxyhafnium and Si$_2$H$_6$. Then, a heat treatment is carried out at a temperature between 250° C. and 400° C. in an atmosphere containing at least one type of gas selected from the group consisting of $O_2$, $O_3$, $N_2O$, and NO at a concentration of 0.001% or more to remove carbon, hydrogen, etc. from the hafnium silicate film 9a. After that, a heat treatment is further carried out in an atmosphere of $NH_3$ or nitrogen plasma to modify the hafnium silicate film 9a into a hafnium silicon oxynitride film 9, as shown in FIG. 5A.

Figure 5B:
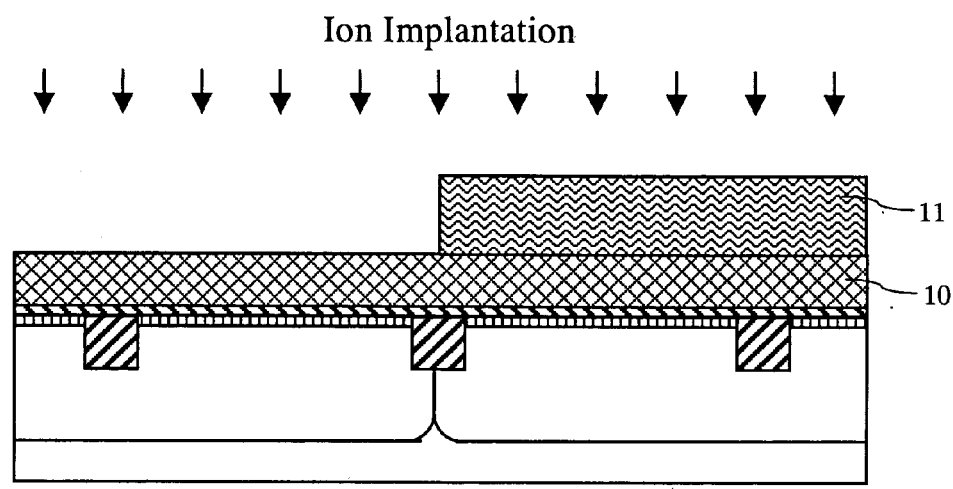

Then, as shown in FIG. 5B, a polysilicon film 10 is formed by a CVD technique, and P is ion-implanted in the portion of the silicon film 10 on the p-type diffusion layer region 7 using a resist 11 as a mask. The film thickness of the silicon film 10 is preferably 2 to 3 times the film thickness of the nickel silicide film 28 later formed. It should be noted that according to the present embodiment, an amorphous silicon film or a silicon germanium film may be used instead of the polysilicon film.

Figure 5C:
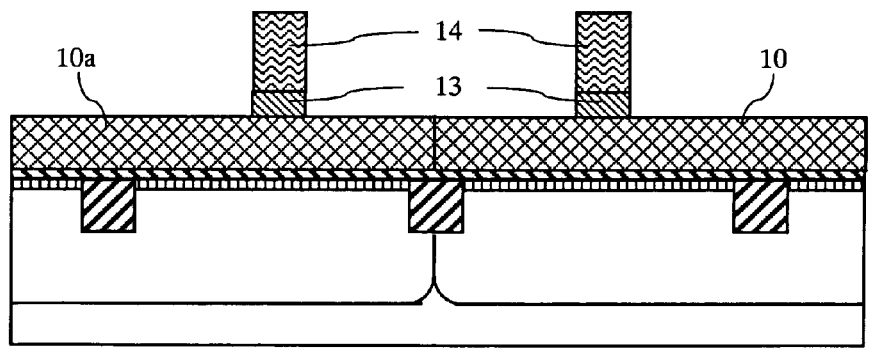

After removing the resist 11, a silicon oxide film 13 is deposited and processed using a resist 14 as a mask, as shown in FIG. 5C.

Figure 6A:
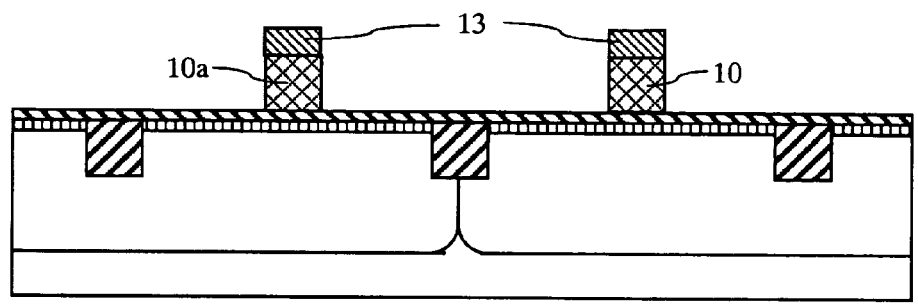
FIGS. 6A to 6C are yet other cross-sectional views illustrating the method for manufacturing the semiconductor device according to the first embodiment.

After removing the resist 14, the n-type silicon film 10a and the undoped silicon film portion (10) are each processed into a gate electrode shape using the silicon oxide film 13 as a hard mask, as shown in FIG. 6A. It should be noted that in FIG. 6A, the gate electrode formed of the silicon film 10 is a dummy gate electrode, and the actual gate electrode is formed in a subsequent process.

Figure 6B:
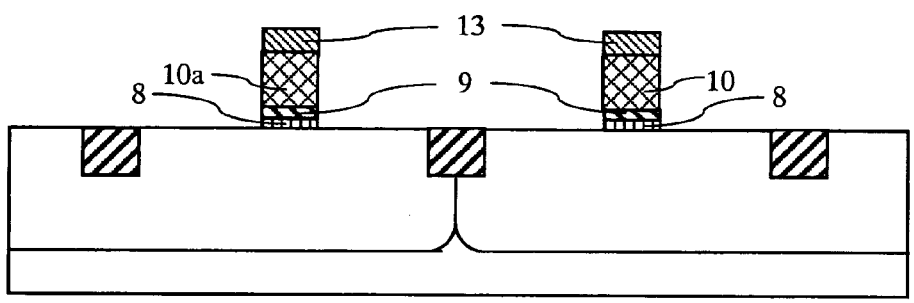

Then, the hafnium silicon oxynitride film 9 is etched (off) using dilute hydrofluoric acid, etc., as shown in FIG. 6B. At that time, the concentration of the hydrofluoric acid and the etching time are determined such that the silicon oxide film 13 used as the hard mask is not removed. According to the present embodiment, the concentration of the hydrofluoric acid and the etching time are preferably 1% or less and 300 seconds or less, respectively. It should be noted that these conditions may be appropriately set depending on the film type and the film thickness of the high dielectric constant insulating film. It should be further noted that since the silicon oxide film 8, which is the underlying interface layer, is very thin (0.5 nm), it is usually completely removed when the hafnium silicon oxynitride film 9 is etched. However, no problem arises if the silicon oxide film 8 is not removed and remains on the entire surface.

Figure 6C:
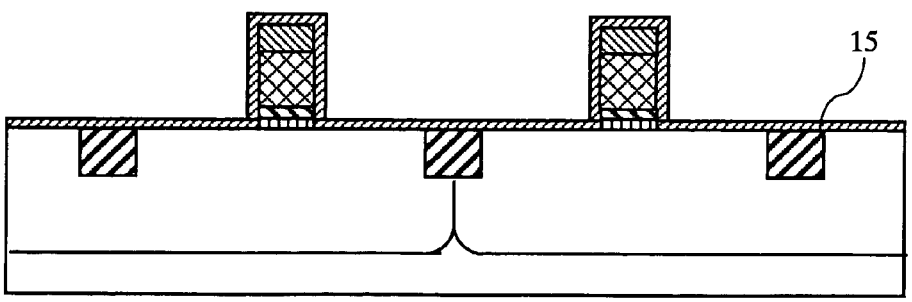

Then, the sides of each electrode and the surface of the silicon substrate 1 are slightly oxidized. For example, a heat treatment may be carried out at 1,000° C. for 5 seconds in an atmosphere containing 0.2% oxygen to oxidize the surfaces to a depth of approximately 2 nm. After that, a silicon oxide film 15 is formed on the entire surface as a first sidewall insulating film by a CVD technique, as shown in FIG. 6C. It should be noted that the silicon oxide film 15 may be a film formed through oxidation. Further, the first sidewall insulating film may be omitted depending on the situation.

Figure 7A:
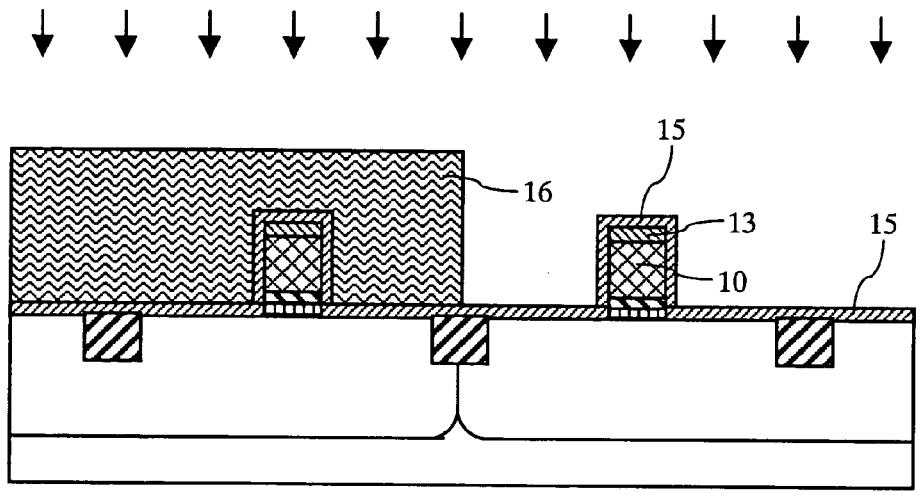
FIGS. 7A to 7C are still other cross-sectional views illustrating the method for manufacturing the semiconductor device according to the first embodiment.
Figure 7B:
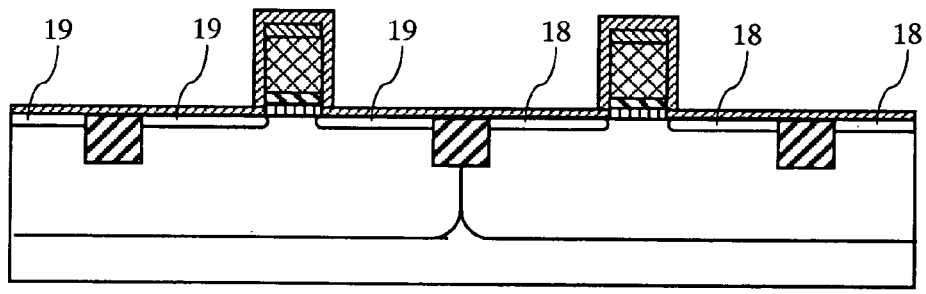

Then, as shown in FIG. 7A, B is ion-implanted in the n-type diffusion layer 6 using as masks a resist 16 and the (PMOS) gate electrode which is formed of the silicon film 10 and has the silicon oxide films 13 and 15 formed thereon. After removing the resist 16, P is ion-implanted in the p-type diffusion layer 7 in the same manner using another resist. After removing the resist, a heat treatment is carried out for activation, forming a p-type extension region 18 and an n-type extension region 19, as shown in FIG. 7B.

Figure 7C:
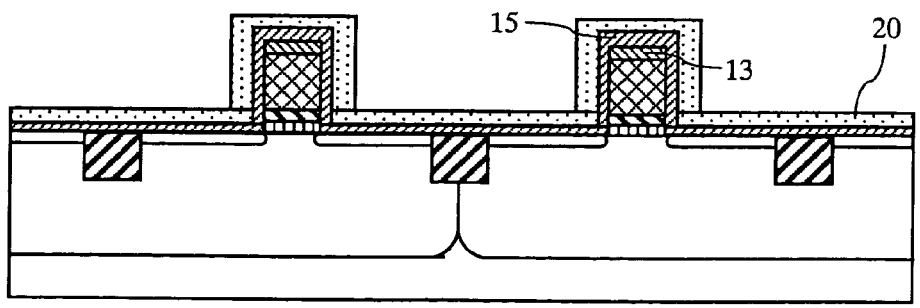

Then, as shown in FIG. 7C, a silicon nitride film 20 is formed as a second sidewall insulating film by a CVD technique. After that, ion reactive etching is carried out to remove portions of the silicon oxide film 15 and the silicon nitride film 20 other than those on the sides of the gate electrodes.

Figure 8A:
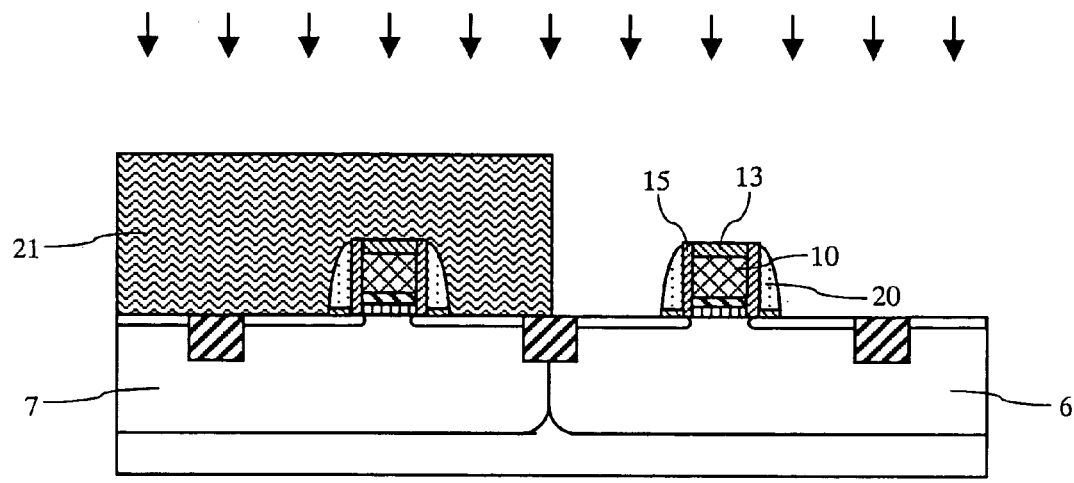
FIGS. 8A to 8C are yet other cross-sectional views illustrating the method for manufacturing the semiconductor device according to the first embodiment.
Figure 8B:
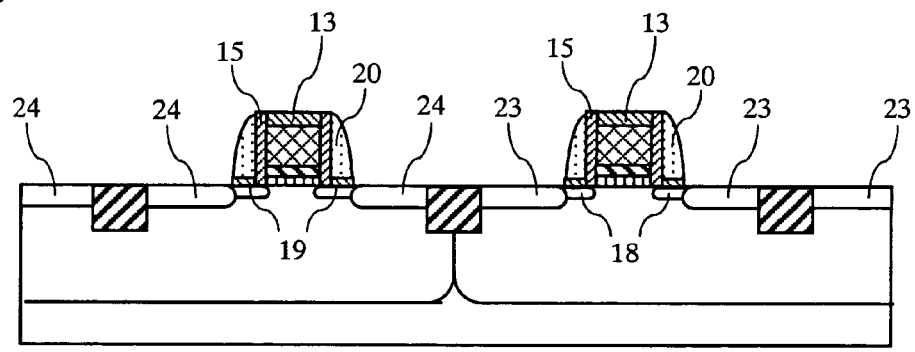

Then, as shown in FIG. 8A, B is ion-implanted in the n-type diffusion layer 6 using as masks a resist 21 and the (PMOS) gate electrode 10 (with a silicon oxide film 13 thereon and with the sidewalls consisting of a silicon oxide film 15 and silicon nitride film 20). At that time, if the hard mask 13 is thin, a small amount of B enters into the gate electrode 10. However, since its concentration is sufficiently low, the B will not penetrate into the silicon substrate 1 during the heat treatment for activation performed in the postprocess. After removing the resist 21, P is ion-implanted in the p-type diffusion layer 7 in the same manner using another resist. After removing the resist, a heat treatment is carried out for activation, forming a p-type source/drain diffusion layer 23 and an n-type source/drain diffusion layer 24, as shown in FIG. 8B.

Figure 8C:
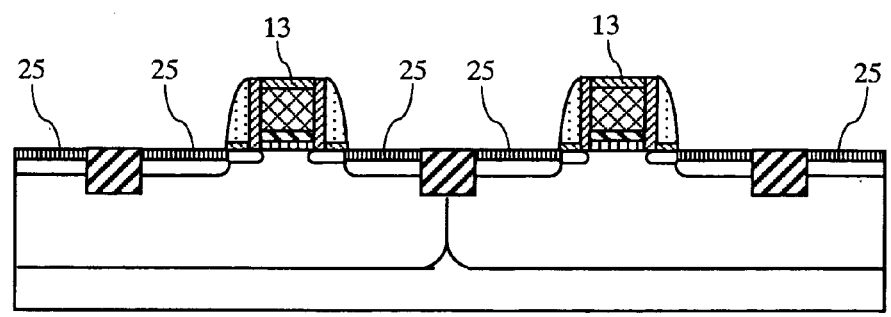
Figure 34A:
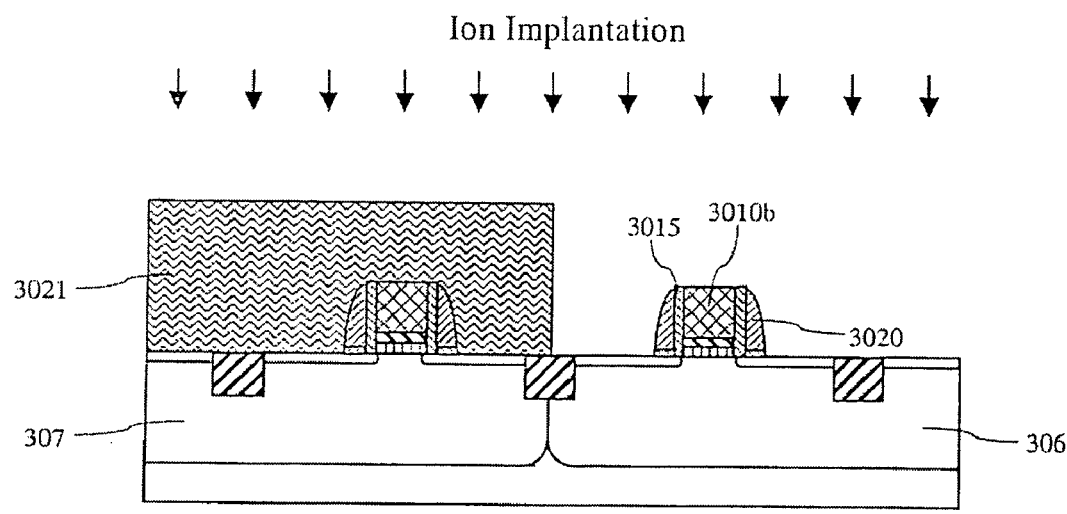
FIGS. 34A to 34C are yet other cross-sectional views illustrating the conventional method for manufacturing the semiconductor device.
Figure 34B:
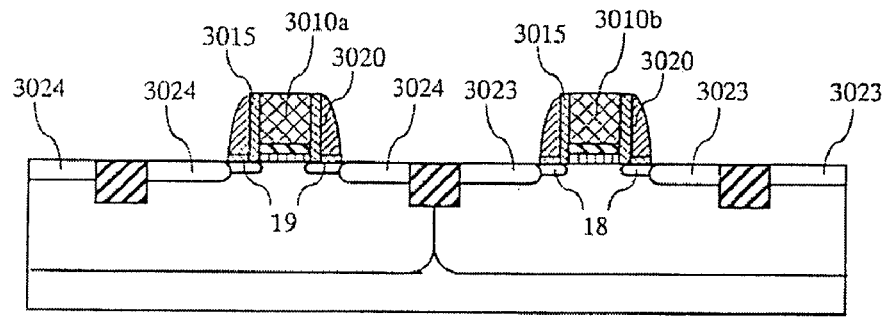
Figure 34C:
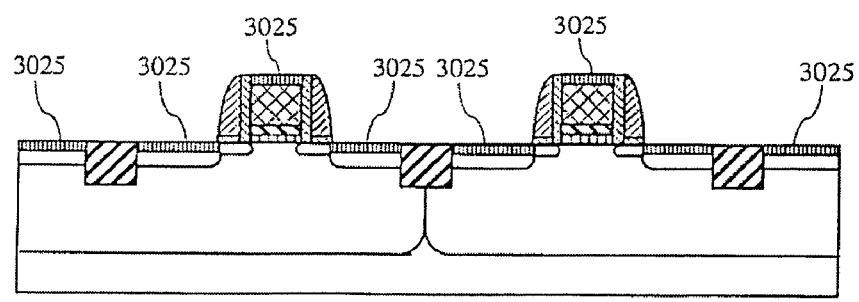
Figure 35:
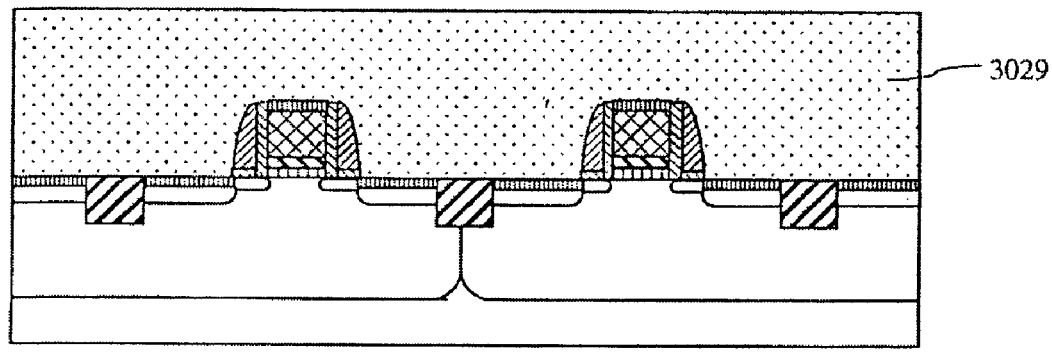
FIG. 35 is yet another cross-sectional view illustrating the conventional method for manufacturing the semiconductor device.
Figure 36A:
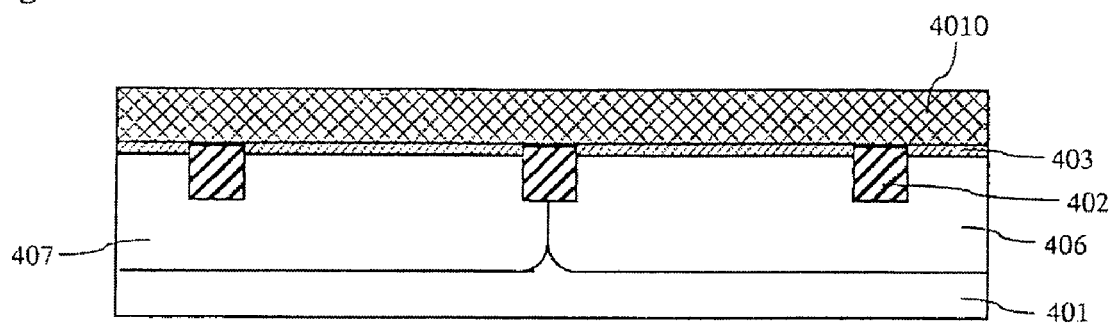
FIGS. 36A to 36C are cross-sectional views illustrating another conventional method for manufacturing a semiconductor device.
Figure 36B:
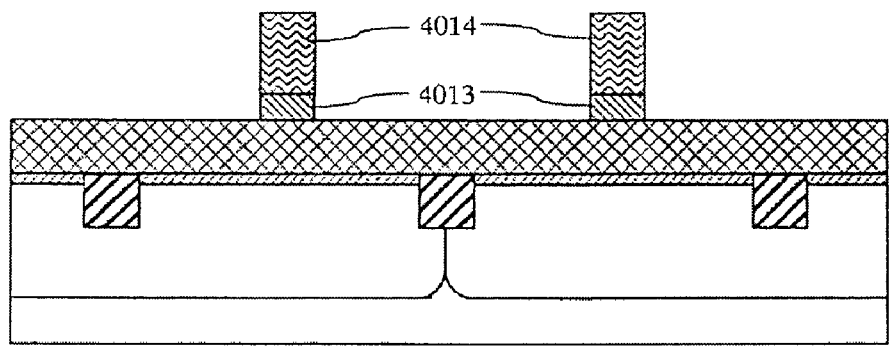
Figure 36C:
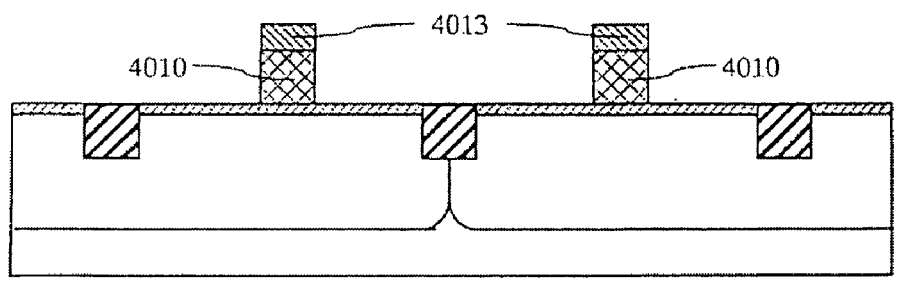
Figure 37A:
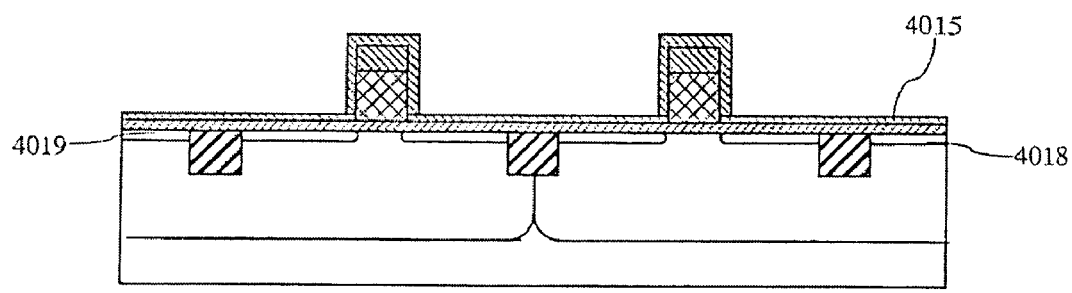
FIGS. 37A to 37C are other cross-sectional views illustrating another conventional method for manufacturing the semiconductor device.
Figure 37B:
Figure 37B:
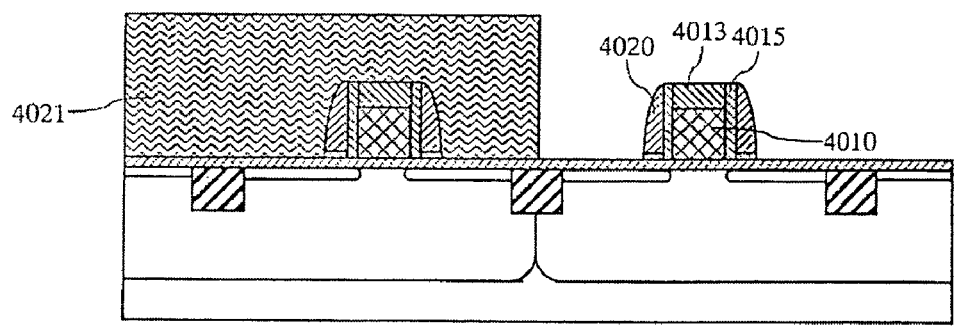
Figure 37C:
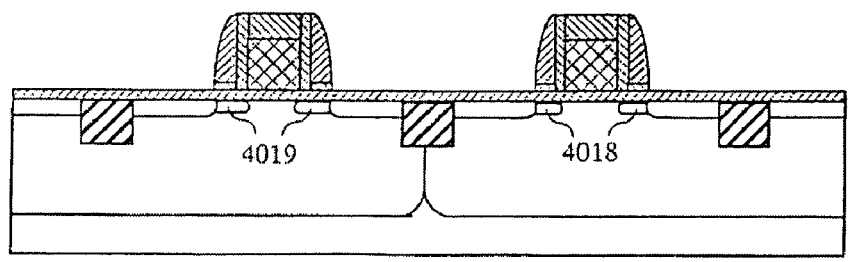
Figure 38A:
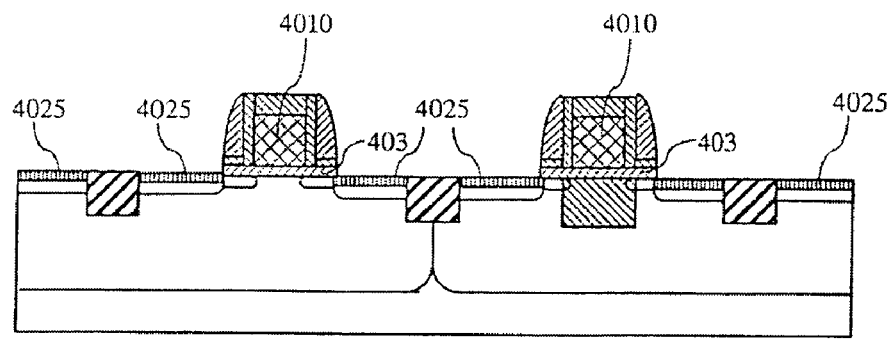
FIGS. 38A to 38C are yet other cross-sectional views illustrating the another conventional method for manufacturing the semiconductor device.
Figure 38B:
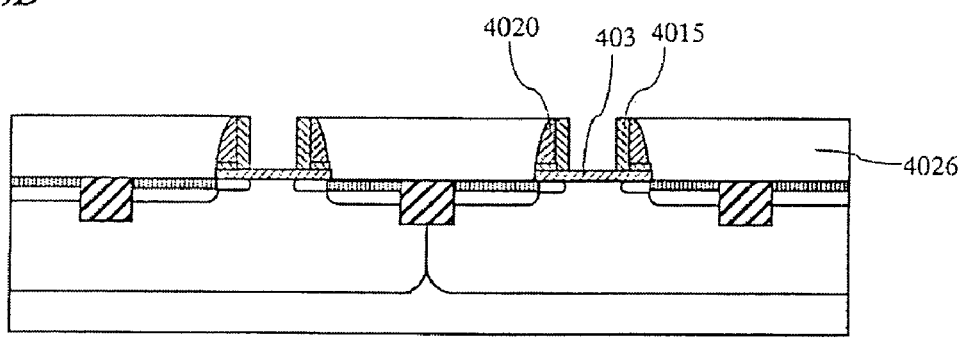
Figure 38C:
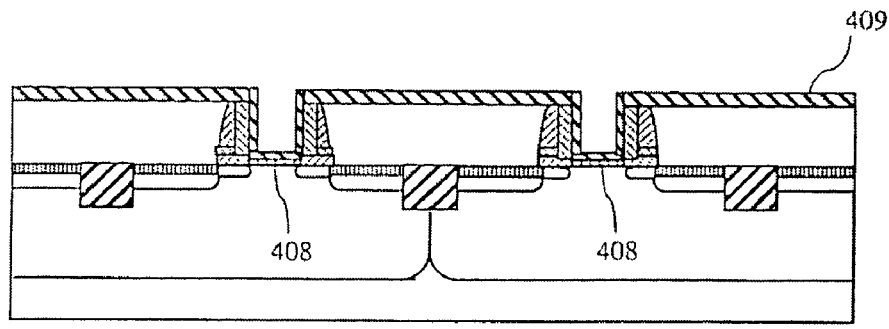
Figure 39:
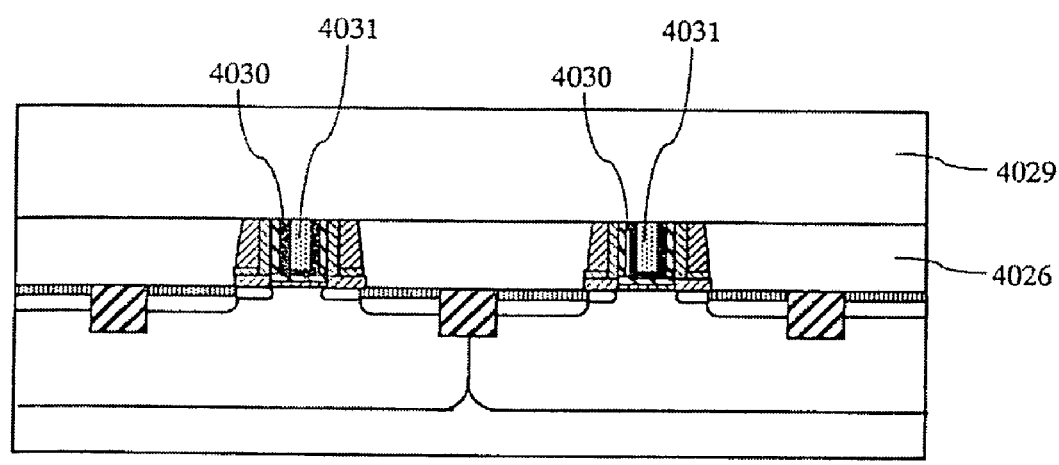
FIG. 39 is still another cross-sectional view illustrating another conventional method for manufacturing the semiconductor device.

Then, after depositing a nickel film (not shown) and a titanium nitride film (now shown) on the entire surface, a heat treatment is carried out to form a nickel silicide 25 on the source/drain diffusion layers 23 and 24 as a first metal silicide film. Then, the titanium nitride and the unreacted portion of the nickel are etched off, as shown in FIG. 8C. It should be noted that the conventional method leaves the surfaces of the silicon gate electrodes exposed at the previous step and therefore the nickel silicide film is also formed on each gate electrode (see FIG. 34C. The present embodiment, on the other hand, forms the silicon oxide film 13 on each gate electrode and therefore the surface of each gate electrode is not exposed. Accordingly, only the nickel on the source/drain diffusion layers 23 and 24 is silicided.

Figure 9A:
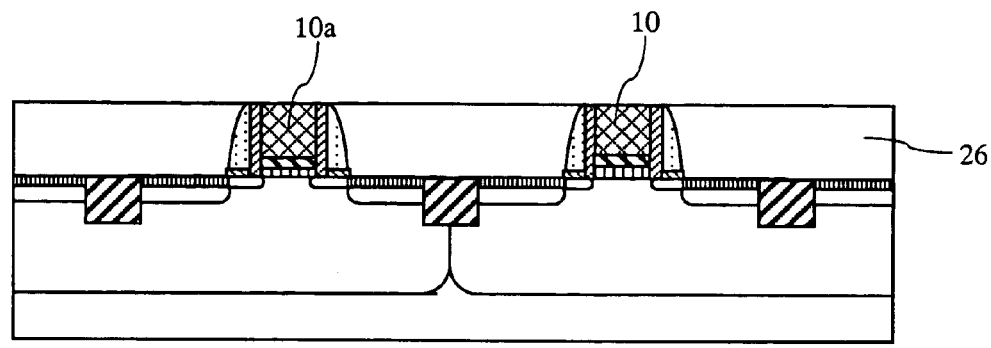
FIGS. 9A to 9c are yet other cross-sectional views illustrating the method for manufacturing the semiconductor device according to the first embodiment.

Then, a first interlayer insulating film 26 is deposited by a CVD technique and processed by a CMP technique so as to expose the surface of the gate electrode formed of the n-type silicon film 10a and that of the dummy gate electrode formed of the undoped silicon film 10, as shown in FIG. 9A. It should be noted that the first interlayer insulating film 26 may be made up of an SiN film (acting as an etching stopper) and a low dielectric constant silicon oxide film.

Then, after masking the gate electrode formed of the n-type silicon film 10a by a resist 27, reactive ion etching is carried out to etch the surface of the dummy gate electrode such that it is set back from the neighboring surfaces. As a result, the film thickness of the dummy gate electrode (made up of the silicon film 10) becomes small. At that time, the silicon oxide film 15 formed on the sides of the electrode may also be etched. However, the etching conditions may be adjusted such that the silicon oxide film 15 remains on the sides of the electrode.

Figure 9B:
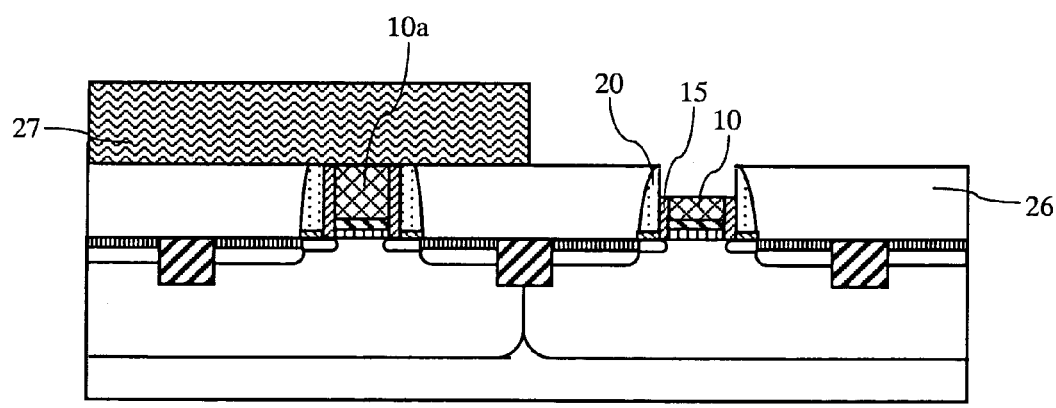
Figure 9C:
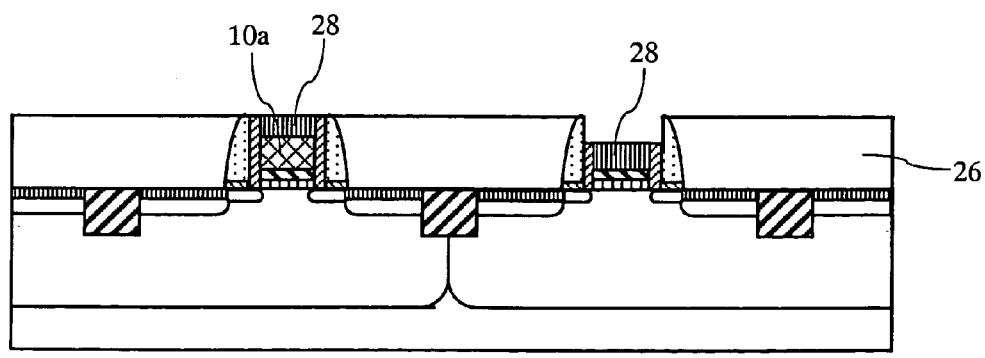

Then, after removing the resist 27, a nickel film (not shown) and a titanium nitride film (not shown) are deposited on the entire surface. Then, a heat treatment is carried out to form nickel silicide 28 in the gate electrode portions as second metal silicide films. After that, the titanium nitride and the unreacted portion of the nickel are etched off, as shown in FIG. 9C. It should be noted that the film thickness of the nickel film is adjusted such that it is equal to or larger than 54% of the film thickness of the dummy gate electrode and smaller than the film thickness of the gate electrode formed of the n-type silicon film 10a. As a result, in the NMOSFET the n-type silicon film 10a is in contact with the hafnium silicon oxynitride film 9, while in the PMOSFET the nickel silicide film 28 is in contact with the hafnium silicon oxynitride film 9. In other words, the above steps change the dummy gate electrode formed of the silicon film 10 into a gate electrode formed of the nickel silicide film 28.

Figure 10:
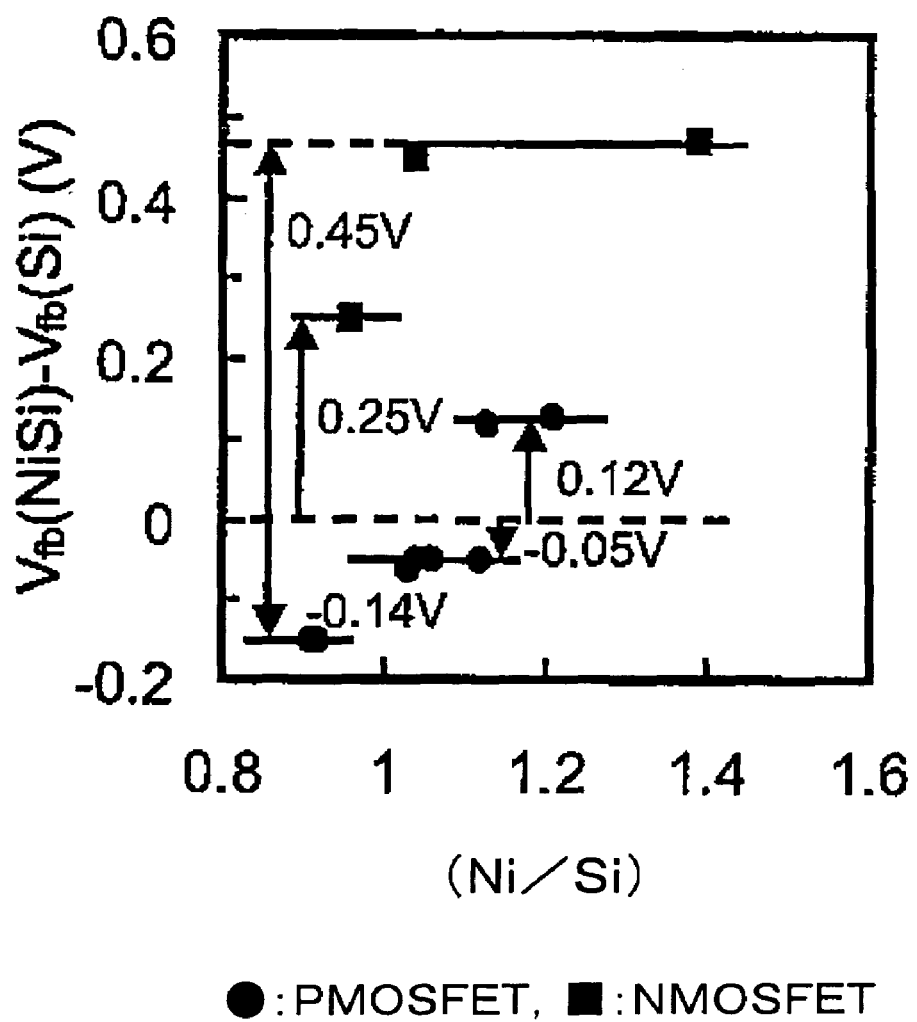
FIG. 10 is a diagram showing the relationships between the Ni/Si ratio of the nickel silicide films of a semiconductor device and the flatband voltages ($V_{fb}$) according to the first embodiment.

FIG. 10 shows the flatband voltages ($V_{fb}$) of the PMOSFET and the NMOSFET of a semiconductor device of the present embodiment when the composition ratio (the ratio of Ni to Si) of the nickel silicide films is changed. The figure indicates that as the proportion of the nickel increases, the flatband $V_{fb}$ of the PMOSFET shifts toward the positive side, as compared to a convention example (using polysilicon electrodes). This means that the threshold voltage also shifts toward the positive side, resulting in reduced drive voltage and reduced power consumption. FIG. 10 also indicates that the ratio (Ni/Si) is preferably between 1.01 and 1.40, more preferably between 1.13 and 1.40.

It should be noted that the rate of silicidation is higher on the silicon film (10a) in which P has been implanted as an n-type impurity than on the undoped silicon film (10). Therefore, the nickel silicide film 28 in the n-type gate electrode portion is formed to a higher thickness than the nickel silicide film 28 in the p-type gate electrode portion. However, since the present embodiment forms the silicon film 10 such that its film thickness is 2 to 3 times the thickness of the nickel silicide films 28, in the n-type gate electrode portion the hafnium silicon oxynitride film 9 still can be in contact with the n-type silicon film 10a even after the nickel silicide film 28 is formed. (In the n-type gate electrode portion, some of the n-type silicon film 10a remains even after the nickel silicide film 28 is formed.)

Further, according to the present embodiment, the n-type impurities diffuse within the n-type silicon film 10a due to the heat treatment carried out to form the nickel silicide films 28. This prevents the gate electrode from being depleted and increases the inversion capacitance, allowing the on-current to be increased. It should be noted that As (arsenic) may be used as the n-type impurity, instead of P. However, P is more effective than As in activating the silicon film since P diffuses at a higher rate.

Further, conventionally, the surfaces of the silicon electrodes are transformed into nickel silicide in the same process in which nickel silicide is formed on the source/drain diffusion regions. In such a case, the nickel silicide is set to have a small thickness in order to reduce the junction leak, resulting in increased gate electrode resistance. The present embodiment, on the other hand, can form a nickel silicide film having a large film thickness on the gate electrodes, allowing the gate electrodes of both the NMOSFET and the PMOSFET to have approximately 10 times lower resistance.

It should be noted that when the gate length is smaller than the film thickness of the nickel film (for example, 37 nm or less), the distance at which the surface of the silicon film 10 is set back from the surface of the first interlayer insulating film 26 may be taken into account. For example, assume that the film thickness of the silicon film 10 is 80 nm and its surface is set back 20 nm from the surface of the first interlayer insulating film 26 after the silicon film 10 is etched. In such a case, if the film thickness of the nickel film in the n-type gate electrode portion is set to 50 nm, the nickel film in the p-type gate electrode portion appears to have a film thickness of 90 nm. Therefore, after the silicidation process, the p-type gate electrode is entirely formed of nickel silicide 28, while the n-type gate electrode has a double structure made up of a lower layer of n-type silicon and an upper layer of nickel silicide 28. It should be noted that if the above method is applied to a p-type transistor having a large gate length (used for a performance test), it may happen that only the upper portion of the gate electrode is formed of the nickel silicide film 28.

Then, a second interlayer insulating film 29 is deposited by a CVD technique or a coating technique and its surface is planarized by a CMP technique, producing the structure shown in FIG. 1. After that, contacts, wiring, etc. are formed.

It should be noted that according to the present embodiment, an appropriate metal film may be buried in the recess of the p-type gate electrode portion so as to align the surfaces of the gate electrodes of the NMOSFET and the PMOSFET. For example, after the step shown in FIG. 9C, a titanium nitride film 30 and a tungsten film 31 may be sequentially formed, and portions of these films other than those in the recess may be removed by a CMP technique. Then, the second interlayer insulating film 29 may be deposited and planarized by a CMP technique, producing the structure shown in FIG. 2.

Alternatively, after the step shown in FIG. 9C, a titanium nitride film 30 and a tungsten film 31 may be sequentially formed, and these films may be processed by reactive ion etching, etc. using a mask, etc. Then, the second interlayer insulating film 29 may be deposited and planarized by a CMP technique, producing the structure shown in FIG. 3.

Further, when the metal silicate film is formed, the present embodiment uses tetra-t-butoxyhafnium as the organic metal material. However, any organic metal material containing the element hafnium or zirconium may be used instead of tetra-t-butoxyhafnium.

The present embodiment is configured such that in the NMOSFET the $n^+$-silicon film is in contact with the high dielectric constant insulating film, while in the PMOSFET the nickel silicide film is in contact with the high dielectric constant insulating film. Therefore, it is possible to optimize the threshold voltages of the NMOSFET and the PMOSFET without separately performing ion implantation operation in each channel, as well as increasing the inversion capacitances.

Further according to the present embodiment, in the manufacturing process, the high dielectric constant insulating film is formed before forming the gate electrodes. This arrangement removes the restriction that the heat treatment temperature must be determined by taking into account the heat resistance of the silicide. This allows the heat treatment to be carried out at a desired temperature, resulting in high-quality gate dielectric films.

Further, according to the present embodiment, the $n^+$-silicon film used as the n-type gate electrode and the source/drain diffusion layers can be activated before forming the gate electrodes. Further, the conventional method etches off the entire silicon film constituting the dummy gate electrode to form the p-type gate electrode, which might damage or even etch off the underlying insulating film together with the silicon film. The present embodiment, on the other hand, does not completely etch off the silicon film; it forms a nickel silicide film using the portion of the silicon film left on the gate dielectric film. This prevents the gate dielectric film from being damaged or etched off.

Further, the present embodiment is configured such that the hafnium silicon oxynitride films (the high dielectric constant insulating films) are formed only under the n-type and p-type gate electrodes; they are not formed on the sides of the gate electrodes. Generally, when a high dielectric constant insulating film is used as a gate dielectric film, if the gate dielectric film is longer than the length of the gate electrode (the gate length), the off-current is large. If, on the other hand, the length of the gate dielectric film is equal to or smaller than the gate length, the off-current is small. The above conventional method for manufacturing a semiconductor device using metal gate electrodes removes the entire silicon film constituting the dummy gate electrode and further removes the sacrificial oxide film by etching, oxidizes the surface of the silicon, and then forms a high dielectric constant insulating film on the entire surface. Therefore, the high dielectric constant (gate) insulating films are inevitably longer than the gate length by twice the film thickness of the high dielectric constant (gate) insulating films, as shown in FIG. 9B. On the other hand, according to the present embodiment, the high dielectric constant insulating films are formed only under the gate electrodes, as shown in FIG. 6B. Or the high dielectric constant insulating films may be even formed such that their length is slightly smaller than the gate length, allowing the off-currents to be reduced.

Figure 11:
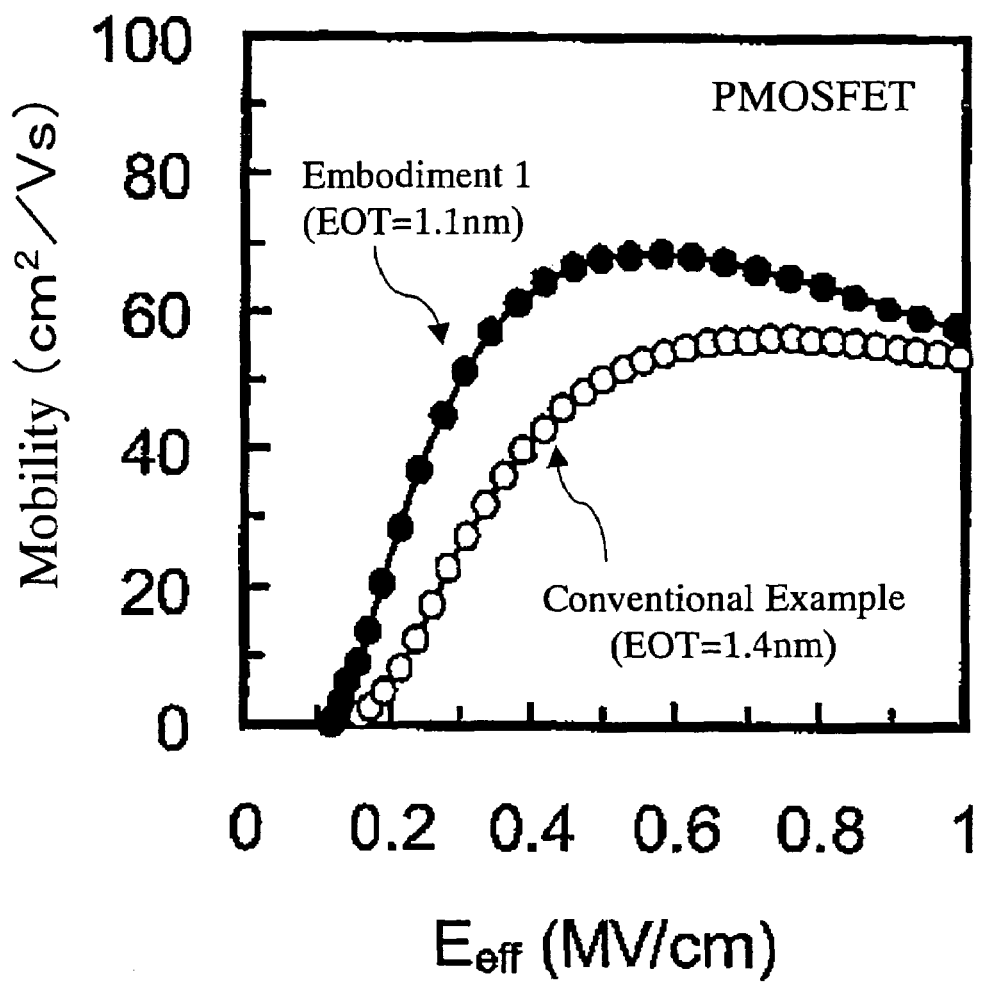
FIG. 11 is a diagram showing the effective carrier mobility of a PMOSFET according to the first embodiment.

FIG. 11 compares the effective carrier mobility of an exemplary PMOSFET of the present embodiment with that of a conventional PMOSFET. As can be seen from the figure, the PMOSFET of the present embodiment has a greater carrier mobility than the conventional PMOSFET. This is attributed to the fact that the polysilicon electrode of the PMOSFET of the present embodiment has a low B (boron) concentration, as compared to the conventional PMOSFET. That is, in the case of the conventional polysilicon electrode, B penetrates through to the substrate, thereby reducing the carrier mobility. In the case of the present embodiment, on the other hand, since the B concentration is low, B does not penetrate through to the substrate, resulting in increased carrier mobility as compared to the conventional PMOSFET.

Figure 12:
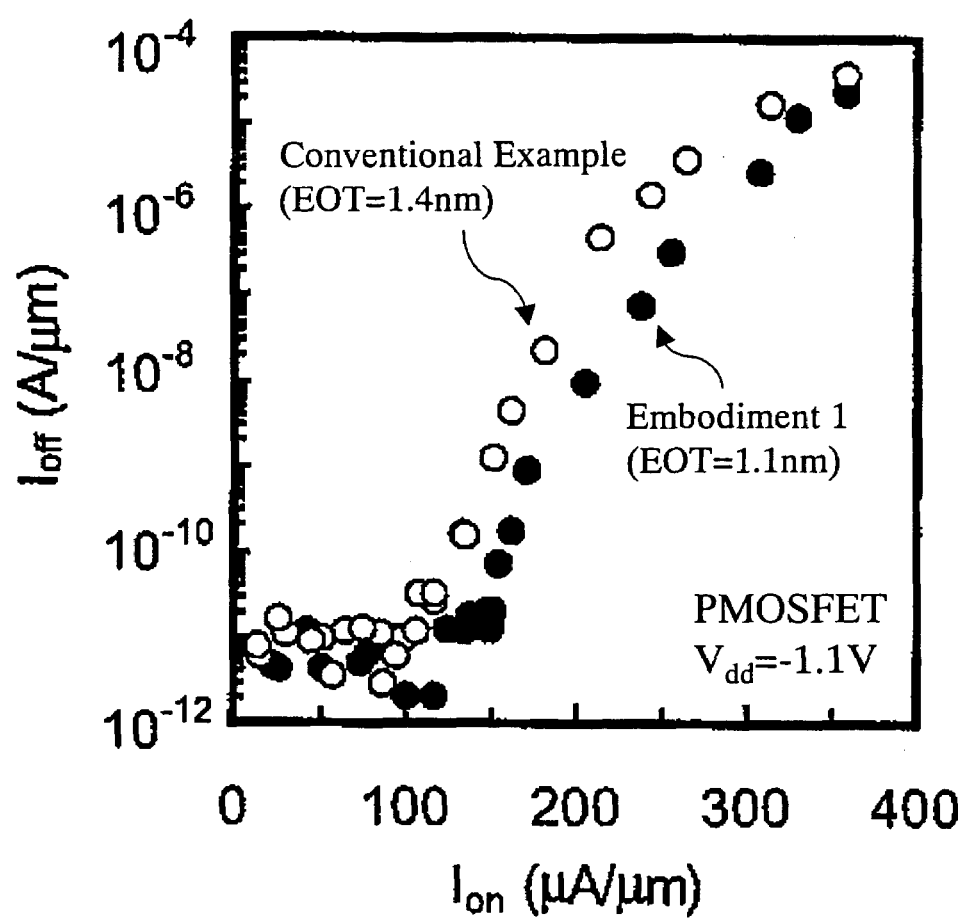
FIG. 12 is a diagram showing the on-current vs. off-current characteristic of a PMOSFET according to the first embodiment.

FIG. 12 compares the on-current vs. off-current characteristic of an exemplary PMOSFET of the present embodiment with that of a conventional PMOSFET. As can be seen from the figure, the PMOSFET of the present embodiment exhibits a higher on-current than the conventional PMOSFET. For example, when the off-current ($I_{off}$) is 20 pA/μm, the PMOSFET of the present embodiment generates an on-current ($I_{on}$) of 150 μA/μm, which is approximately 40% higher than the on-current (106 μA/μm) of the convention PMOSFET.

Second Embodiment

Figure 13:
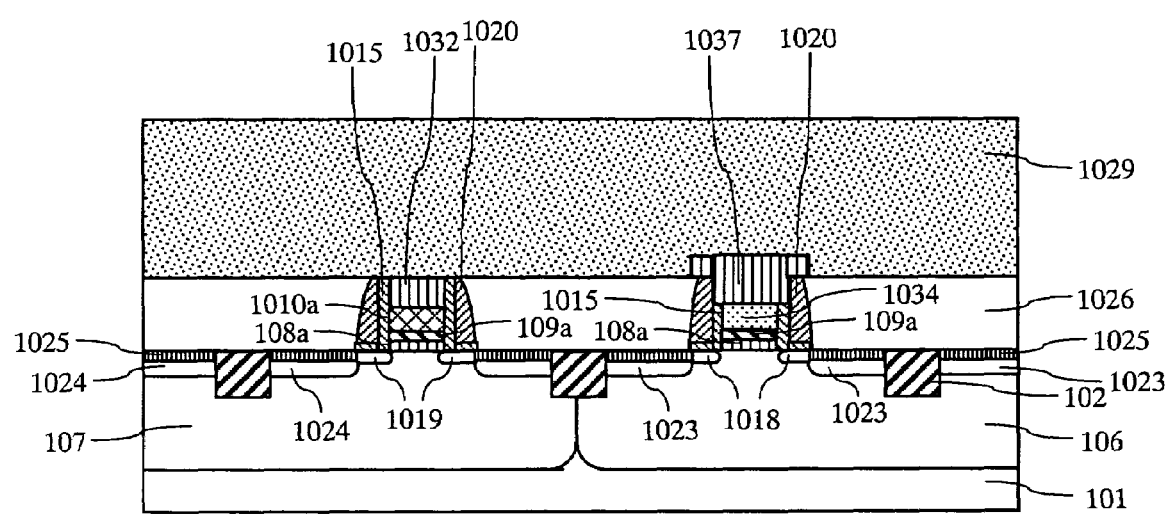
FIG. 13 is a cross-sectional view of a semiconductor device according to a second embodiment of the present invention.

FIG. 13 is a cross-sectional view of a semiconductor device according to a second embodiment of the present invention.

Referring to the figure, a element isolation insulating film 102 is formed around the device regions in a silicon substrate 101. Within the device regions are formed an n-type diffusion layer region 106, a p-type diffusion layer region 107, a p-type extension region 1018, an n-type extension region 1019, a p-type source/drain region 1023, an n-type source/drain region 1024, and a nickel silicide film 1025.

The gate dielectric film formed on each channel is made up of a first insulating film and a second insulating film formed on the first insulating film. The first insulating film is a silicon oxynitride film 108a acting as an underlying interface layer, while the second insulating film is a hafnium silicate film 109a, which is a high dielectric constant insulating film.

The n-type gate electrode is made up of an n-type silicon film 1010a and a titanium silicide film 1032 formed on the n-type silicon film 1010a. The p-type gate electrode, on the other hand, is made up of a ruthenium film 1034 and a titanium silicide film 1032 formed on the ruthenium film 1034. A silicon oxide film 1015 and a silicon nitride film 1020 are formed on the sides of each gate. However, the hafnium silicate films 109a are not formed on the sides of the gates.

Figure 14:
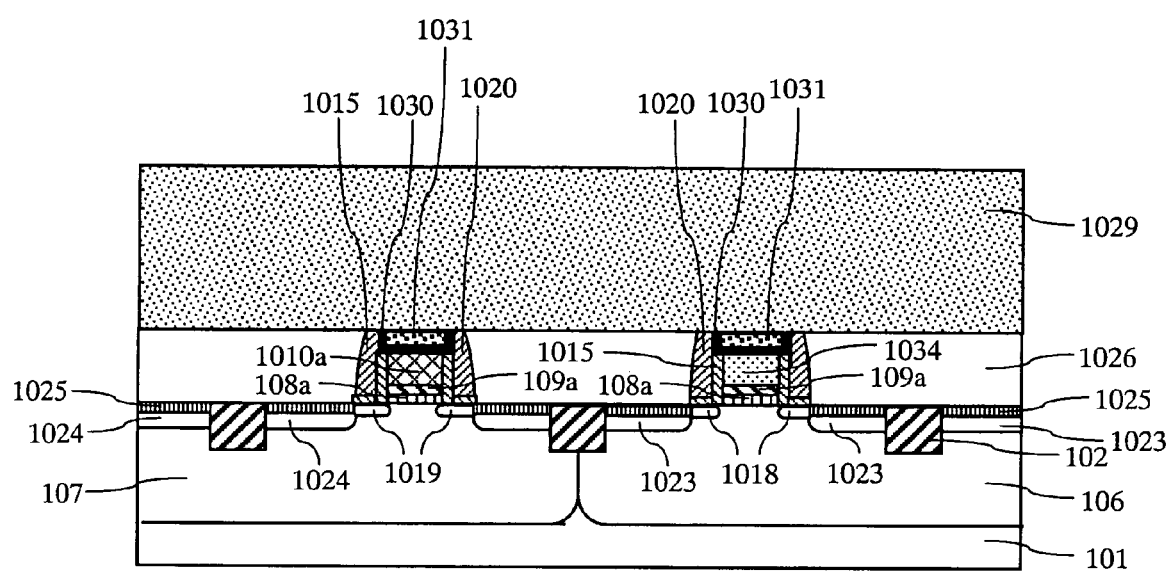
FIG. 14 is a cross-sectional view of another semiconductor device according to the second embodiment.

FIG. 14 shows a cross-sectional view of another semiconductor device according to the present embodiment. The semiconductor device shown in FIG. 14 is different from that shown in FIG. 13 in that a titanium nitride film 1030 and a tungsten film 1031 are formed instead of the titanium suicide film 1032 shown in FIG. 13.

Thus, the present embodiment is characterized in that: in the n-type electrode portion, the n-type silicon electrode is in contact with the gate dielectric film; and in the p-type gate electrode portion, ruthenium is in contact with the gate dielectric film. The present embodiment is also characterized in that the hafnium silicate films 109a are formed only under the n-type and p-type gate electrodes (they are not formed on the sides of the gate electrodes).

It should be noted that even though the examples in FIGS. 13 and 14 use hafnium silicate films as the high dielectric constant insulating films, the present invention is not limited to this particular type of high dielectric constant insulating film. Examples of other high dielectric constant insulating films include zirconium silicate nitride films, hafnium silicate films and zirconium silicate films (which do not contain nitrogen), and hafnium oxide films and zirconium oxide films (which do not contain silicon). Further, the high dielectric constant insulating films may be formed of a material containing both hafnium and zirconium.

It should be further noted that even though the above examples use the silicon oxynitride films 108a as the underlying interface layers, the present invention is not limited to this particular type of interface layer. Silicon oxide films or silicon nitride films may be used as the underlying interface layers, instead of the silicon oxynitride films.

Further, according to the present embodiment, a silicon oxide film, a silicon nitride film, or a silicon oxynitride film may be formed on each high dielectric constant insulating film.

A description will be given below of a method for manufacturing a semiconductor device according to the present embodiment with reference to FIGS. 15 to 17. It should be noted that in these figures, like numerals will be used to denote like components.

The present embodiment performs the same steps as the first embodiment until, and including, the step in which a first interlayer insulating film 1026 is formed and processed by a CMP technique such that the surfaces of the n-type silicon film 1010a and an undoped silicon film 1010 are exposed. Therefore, the explanation of these steps will be omitted. However, the present embodiment is different from the first embodiment in that each gate dielectric film is made up of a silicon oxynitride film 108a and a hafnium silicate film 109a.

Figure 15A:
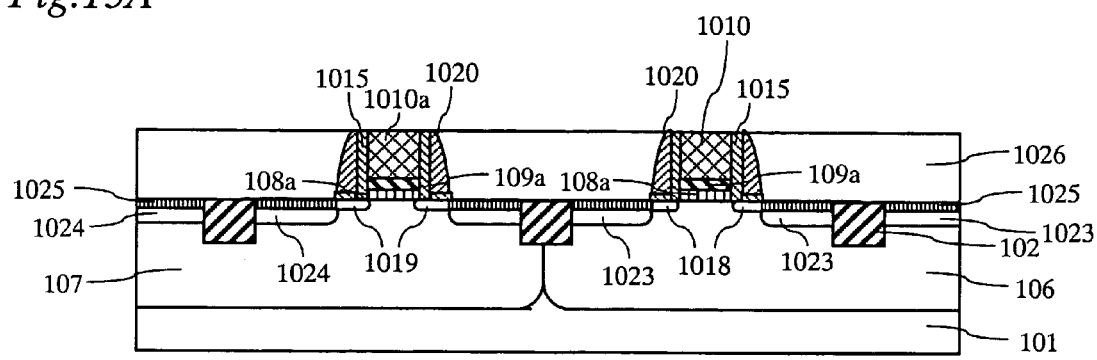
FIGS. 15A to 15C are cross-sectional views illustrating a method for manufacturing a semiconductor device according to the second embodiment.
Figure 15B:
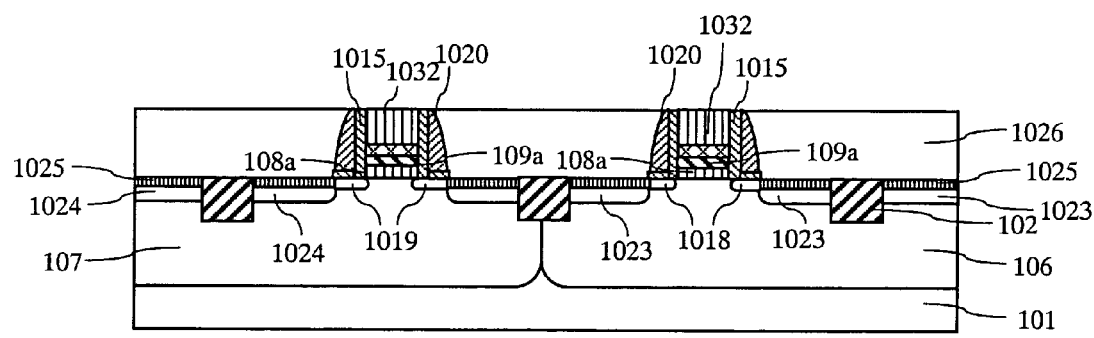

First, after forming the structure shown in FIG. 15A, a titanium film (not shown) acting as a first metal film and a titanium nitride film (not shown) are deposited on the entire surface. Then, a heat treatment is carried out at 540° C., and the unreacted portions of the titanium nitride film and the titanium film are removed, forming as a second metal silicide film a titanium silicide film 1032 on the surfaces of the n-type silicon film 1010a and the undoped silicon film 1010, as shown in FIG. 15B.

According to the present embodiment, the n-type impurities diffuse within the n-type silicon 1010a due to the heat treatment carried out to form the titanium silicide film 1032. This prevents the gate electrode from being depleted as well as increasing the inversion capacitance, allowing the on-current to be increased. It should be noted that As (arsenic)

may be used as the n-type impurity, instead of P. However, P is more effective than As in activating the silicon film since P diffuses at a higher rate.

Figure 15C:
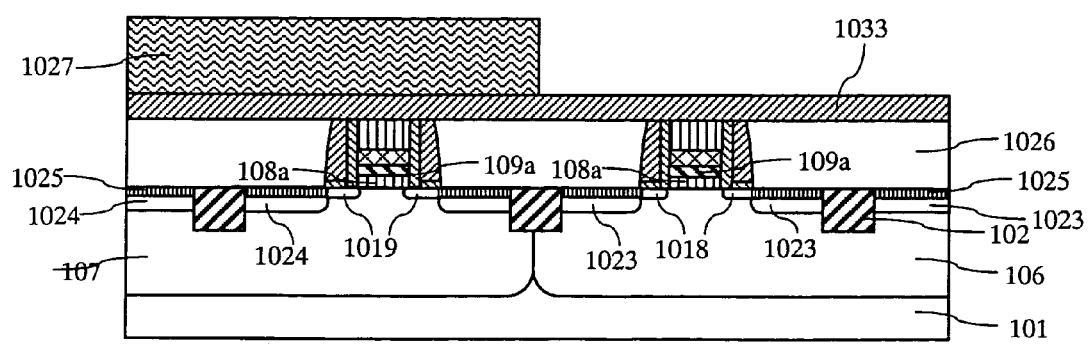
Figure 16A:
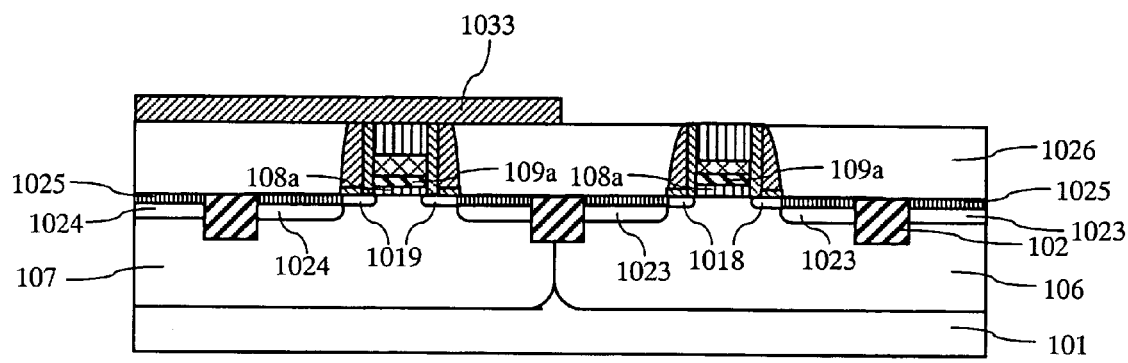
FIGS. 16A to 16C are other cross-sectional views illustrating the method for manufacturing the semiconductor device according to the second embodiment.
Figure 17A:
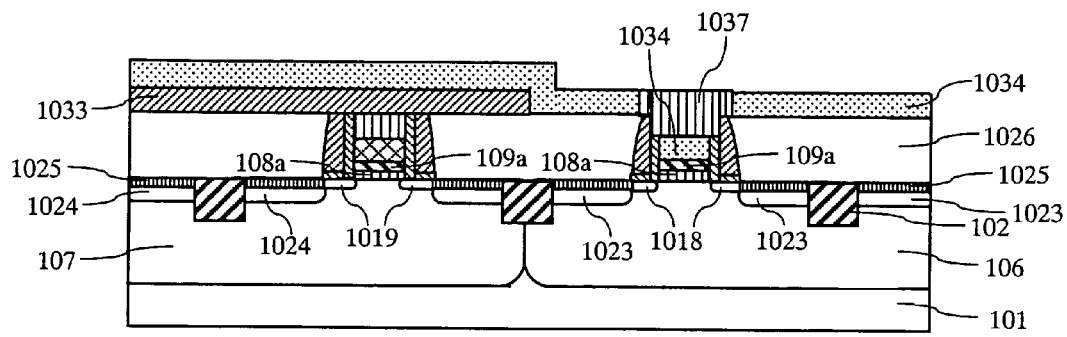
FIGS. 17A to 17C are yet other cross-sectional views illustrating the method for manufacturing the semiconductor device according the second embodiment.

Subsequently, a silicon nitride film 1033 is deposited on the entire surface, as shown in FIG. 15C, and processed using a resist 1027 as a mask, leaving the silicon nitride film 1033 only on the n-type gate dielectric film region, as shown in FIG. 16A. (The remaining silicon nitride film 1033 is used as a hard mask.)

Figure 16B:
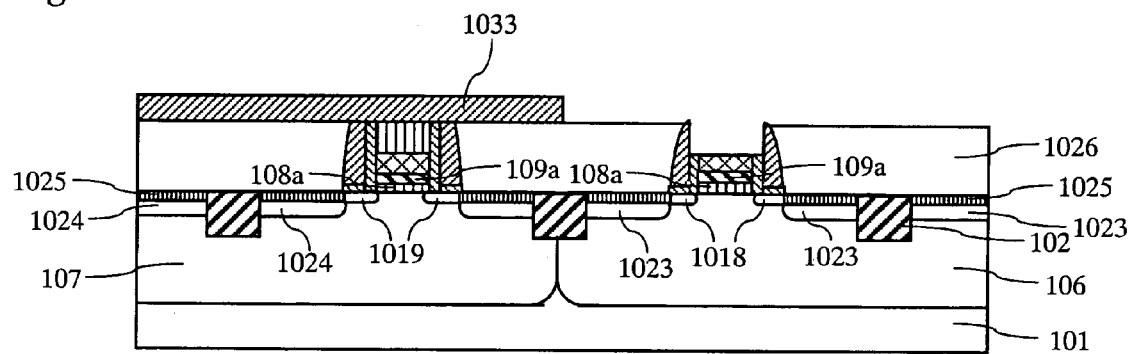
Figure 16C:
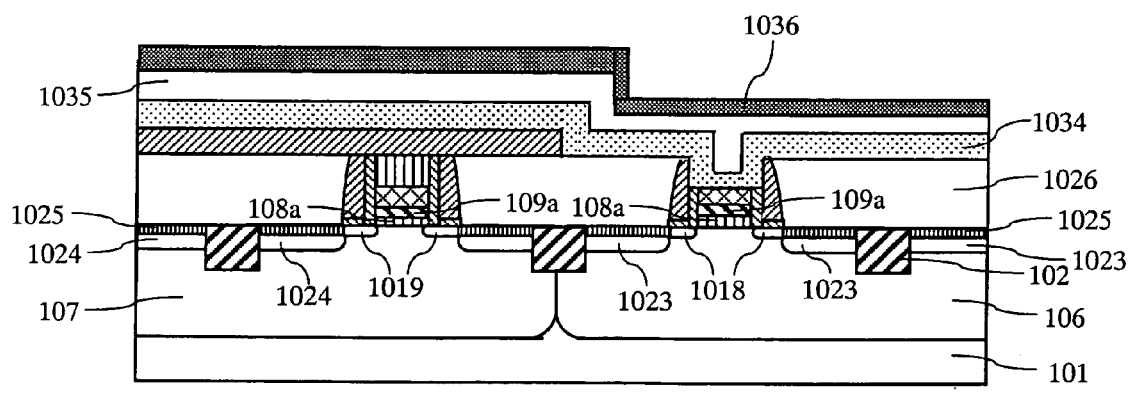

Then, the titanium silicide film 1032 on the p-type dummy silicon gate electrode is etched off using dilute hydrofluoric acid, etc., as shown in FIG. 16B. After that, a ruthenium film 1034 (a second metal film), a titanium film 1035 (a third metal film), and a titanium nitride film 136 are sequentially deposited on the entire surface, as shown in FIG. 16C. Then, a heat treatment is carried out at 540° C., causing the ruthenium film 1034 to react with the dummy silicon gate electrode 1010 and thereby form a ruthenium silicide. At that time, silicon within the formed ruthenium silicide reacts with the overlying titanium film 1035, forming a titanium silicide.

The time it takes for the above reactions to complete depends on the film thickness of the undoped silicon film 1010 (constituting the dummy gate electrode). For example, if the film thickness of the titanium film 1035 is one-half or more of the film thickness of the silicon film 1010, then the reactions eventually leads to formation of a ruthenium film 1034 on the hafnium silicate film 109a and formation of the titanium silicate film 1037 (acting as a third metal silicide film) on the ruthenium film 1034 (in the p-type gate electrode portion). That is, it appears as if the ruthenium film 1034 has replaced the lower portion of the silicon film 1010 and the remaining silicon film 1010 has reacted with the titanium film 1035 (forming the titanium silicide film 1037). After that, the titanium nitride film 1036 and the unreacted portion of the titanium film 1035 are etched off, producing the structure shown in FIG. 17A.

Figure 17B:
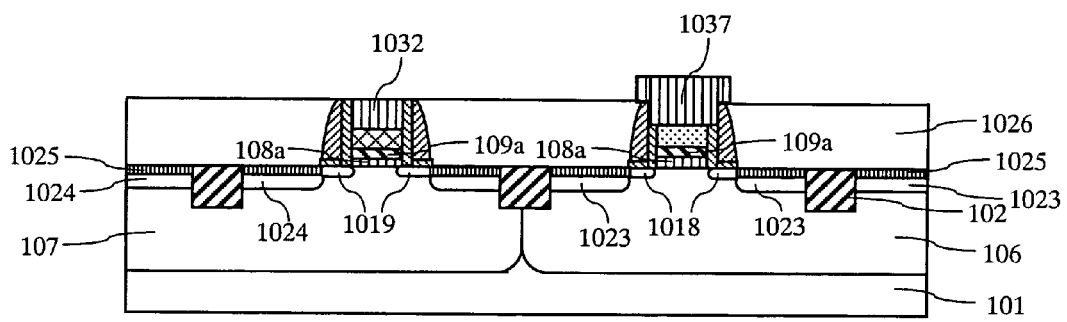

Subsequently, the ruthenium film 1034 on the first interlayer insulating film 1026 and on the silicon nitride film 1033 used as the hard mask is etched off using oxygen plasma containing chlorine, and then the silicon nitride film 1033 is removed by reactive ion etching or using hot phosphorusic acid, as shown in FIG. 17B. Then, after depositing a second interlayer insulating film 1029 by a CVD technique or a coating technique, its surface is planarized by a CMP technique, producing the structure shown in FIG. 13. It should be noted that the second interlayer insulating film 1029 may be made up of a low dielectric constant silicon oxide film and an SiN film acting as an etching stopper. After the planarization process, contacts, wiring, etc. are formed.

It should be noted that the titanium silicide films 1032 and 1037 formed on the gate electrodes in the manner described above exist as the high resistivity C49 phase, not as the low resistivity C54 phase, since these films are formed at a low temperature. In this case, since the titanium silicide films 1032 and 1037 are present only on the n-type and p-type gate electrodes, respectively, these films can be formed to have a large film thickness. Therefore, no problem arises if the titanium silicide films 1032 and 1037 exist as the high resistivity phase. However, the following method may be used to produce gate electrodes having lower resistivity.

Figure 17C:
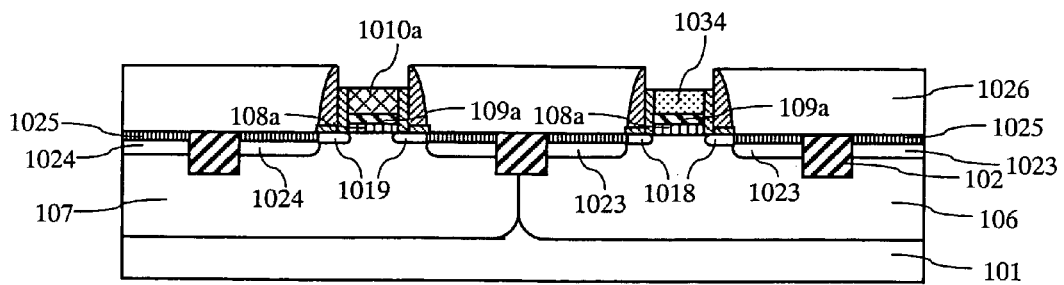

First, after forming the structure shown in FIG. 17B, the titanium silicide films 1032 and 1037 are etched off using dilute hydrofluoric acid, etc., as shown in FIG. 17C. After that, a titanium nitride film 1030 and a tungsten film 1031 are deposited on the entire surface and processed by a CMP technique such that they are left only in the recesses of the n-type and p-type gate electrode portions. Then, the second interlayer insulating film 1029 is deposited and planarized by a CMP technique, producing the structure shown in FIG. 14.

Alternatively, after forming the structure shown in FIG. 17C, the titanium nitride film 1030 and the tungsten film 1031 may be sequentially formed and processed by reactive ion etching, etc. using a mask, etc. After that, the second interlayer insulating film 1029 may be deposited and planarized by a CMP technique, producing a structure (not shown) similar to that shown in FIG. 3 described in connection with the first embodiment.

The present embodiment is different from the first embodiment in two respects: first, after forming the titanium silicide film 1032, the portion of the titanium silicide film 1032 in the p-type gate electrode portion is etched off so as to reduce the film thickness of the silicon film 1010, which is the dummy p-type gate electrode; and second, the ruthenium film 1034 is brought into contact with the surface of the hafnium silicate film 109a (in the p-type gate electrode portion) by a silicon replacement technique.

It should be noted that according to the present embodiment, the surface of the silicon film 1010 is set back from the neighboring surfaces by etching off the titanium silicide film 1032. However, this may be done by directly processing the silicon film 1010 through reactive ion etching, or by both etching off the titanium silicide film 1032 and applying reactive ion etching to the silicon film 1010 at the same time.

Further, even though the present embodiment replaces the silicon film 1010 constituting the dummy gate electrode by ruthenium, the present invention is not limited to this particular type of metal. Instead of the ruthenium film, it is possible to use any metal film which provides a metal element as a diffusing species during silicide formation. Examples of such metals include platinum, palladium, nickel, and cobalt. However, when a metal, such as ruthenium, which cannot be easily etched by oxygen plasma is used, the unreacted portion of the metal film left on the first interlayer insulating film 1026 needs to be removed by sputtering etching or by a chemical mechanical removal technique such as the CMP.

Further, though the present embodiment has been described as using the silicon oxynitride films 108a as the underlying interface layers, silicon oxide films (as in the first embodiment) or silicon nitride films may be used instead of the silicon oxynitride films 108a.

Further, though the present embodiment has been described as forming the nickel silicide film 1025 on the source/drain diffusion layers, other silicides such as cobalt silicide and titanium silicide may be used instead of nickel silicide.

Third Embodiment

FIGS. 18 to 24 are cross-sectional views of semiconductor devices according to a third embodiment of the present invention.

Figure 18:
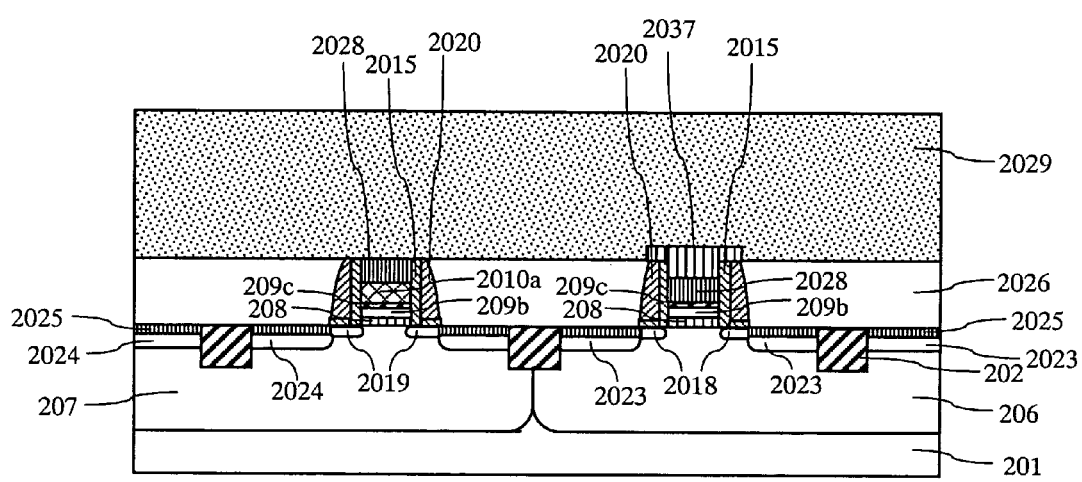
FIG. 18 is a cross-sectional view of a semiconductor device according to a third embodiment of the present invention.

Referring to FIG. 18, a element isolation insulating film 202 is formed around the device regions in a silicon substrate 201. Within the device regions are formed an n-type diffusion layer region 206, a p-type diffusion layer region 207, a p-type extension region 2018, an n-type extension region 2019, a p-type source/drain region 2023, an n-type source/drain region 2024, and a nickel silicide film 2025.

The gate dielectric film formed on each channel is made up of a first insulating film and a second insulating film formed on the first insulating film. The first insulating film is a silicon oxide film 208 acting as an underlying interface layer, while the second insulating film is a high dielectric constant insulating film made up of a hafnium oxide film 209*b* and a silicon nitride film 209*c* formed on the hafnium oxide film 209*b*.

The n-type gate electrode is made up of an n-type silicon film 2010*a* and a nickel silicide film 2028 formed on the n-type silicon film 2010*a*. The p-type gate electrode, on the other hand, is made up of a nickel silicide film 2028 and a titanium silicide film 2037 formed on the nickel silicide film 2028. A silicon oxide film 2015 and a silicon nitride film 2020 are formed on the sides of each gate. However, the hafnium oxide films 209*b* are not formed on the sides of the gates.

Figure 19:
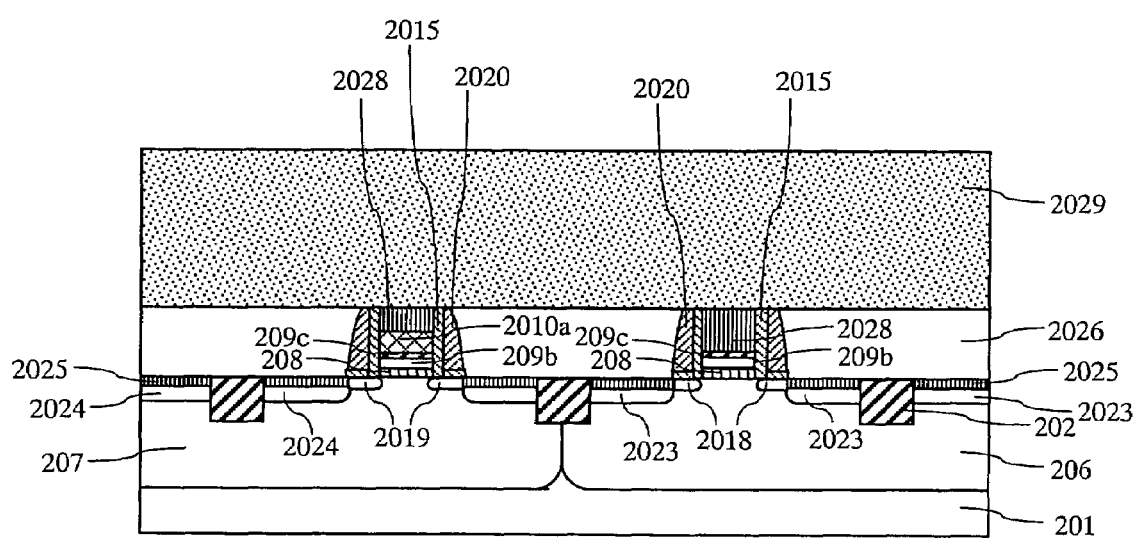
FIG. 19 is a cross-sectional view of another semiconductor device according to the third embodiment.

The semiconductor device shown in FIG. 19 is different from that shown in FIG. 18 in that the p-type gate electrode is made up of only the nickel silicide film 2028.

Figure 20:
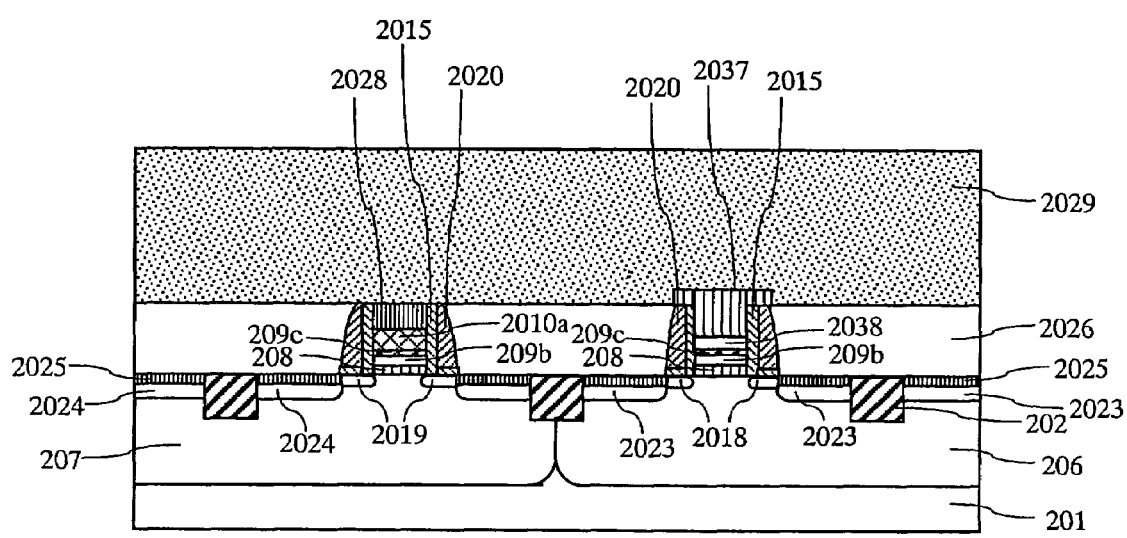
FIG. 20 is a cross-sectional view of yet another semiconductor device according to the third embodiment.

The semiconductor device shown in FIG. 20 is different from that shown in FIG. 18 in that (in the p-type gate electrode portion), the gate dielectric film is in contact with a nickel film 2038 instead of the nickel silicide film 2028.

Figure 21:
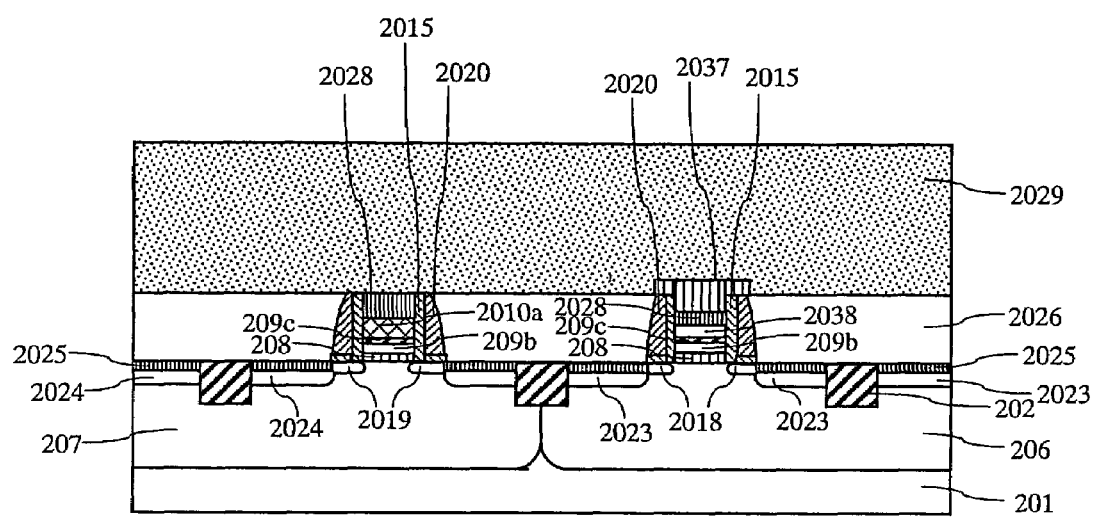
FIG. 21 is a cross-sectional view of still another semiconductor device according to the third embodiment.

The semiconductor device shown in FIG. 21 is different from that shown in FIG. 18 in that (in the p-type gate electrode portion), the nickel silicide film 2028 is formed between a nickel film 2038 and the titanium silicide film 2037.

Figure 22:
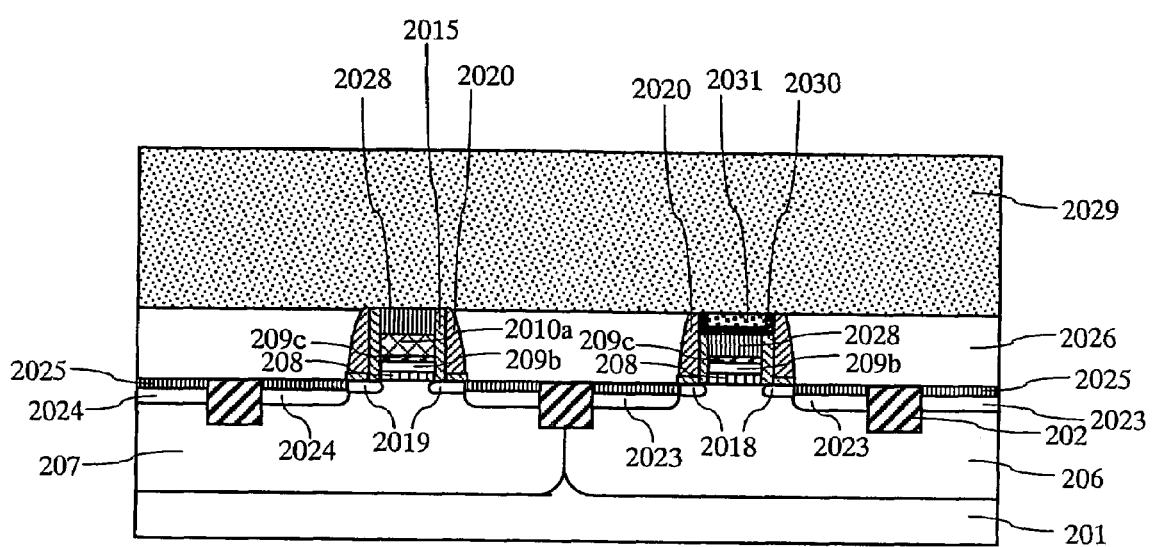
FIG. 22 is a cross-sectional view of yet another semiconductor device according to the third embodiment.
Figure 23:
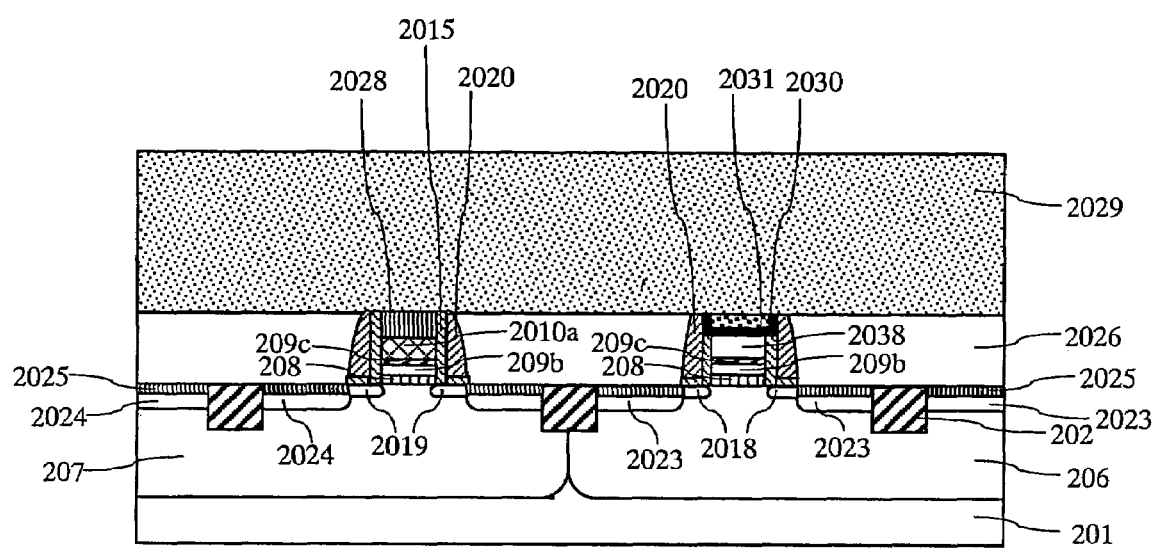
FIG. 23 is a cross-sectional view of yet another semiconductor device according to the third embodiment.
Figure 24:
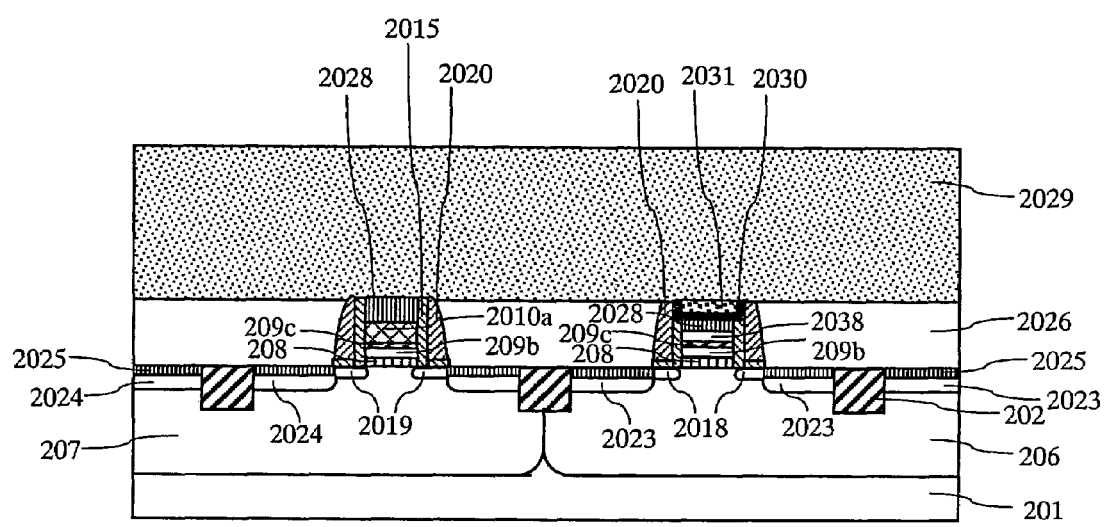
FIG. 24 is a cross-sectional view of still another semiconductor device according to the third embodiment.

The semiconductor devices shown in FIGS. 22 to 24 are different from those shown in FIGS. 18 to 20 in that a titanium nitride film 2030 and a tungsten film 2031 are formed on the top of the p-type gate electrode, instead of the titanium silicide film 2037. Further, according to the present invention, a titanium film may be formed under the titanium nitride film 2030.

Thus, the present embodiment is characterized in that: in the n-type gate electrode portion, the n-type silicon electrode is in contact with the gate dielectric film; and in the p-type gate electrode portion, the nickel silicide film 2028 or the nickel film 2038 is in contact with the gate dielectric film. The present embodiment is also characterized in that the hafnium oxide films 209*b* are formed only under the n-type and p-type gate electrodes (they are not formed on the sides of the gate electrodes).

It should be noted that even though the examples shown in FIGS. 18 to 24 use hafnium oxide films as the high dielectric constant insulating films, the present invention is not limited to this particular type of high dielectric constant insulating film. Examples of other high dielectric constant insulating films include zirconium oxide films, hafnium silicate films and zirconium silicate films (which contain silicon), and hafnium silicon oxynitride films and zirconium silicate nitride films (which contain nitrogen). Further, the high dielectric constant insulating films may be formed of a material containing both hafnium and zirconium.

It should be further noted that even though the above examples use the silicon oxide films 208 as the underlying interface layers, the present invention is not limited to this particular type of interface layer. Silicon oxynitride films or silicon nitride films may be used as the underlying interface layers, instead of the silicon oxide films.

Further, though in the above examples a silicon nitride film is formed on each high dielectric constant insulating film, the present invention is not limited to this particular arrangement. For example, a silicon oxide film or a silicon oxynitride film may be formed on each high dielectric constant insulating film. Further, the high dielectric constant insulating films may be in direct contact with the gate electrode material.

A description will be given below of methods for manufacturing a semiconductor device according to the present embodiment with reference to FIGS. 25 to 28. It should be noted that in these figures, like numerals will be used to denote like components.

The present embodiment performs the same steps as the first and second embodiments until, and including, the step in which a first interlayer insulating film 2026 is formed and processed by a CMP technique such that the surfaces of the n-type silicon film 2010*a* and an undoped silicon film 2010 are exposed. Therefore, the explanation of these steps will be omitted. However, the present embodiment is different from the first and second embodiments in that each gate dielectric film is made up of a silicon oxide film 208, a hafnium oxide film 209*b*, and a silicon nitride film 209*c*. It should be noted that the first interlayer insulating film 2026 may be made up of a low dielectric constant silicon oxide film and an SiN film acting as an etching stopper.

Figure 25A:
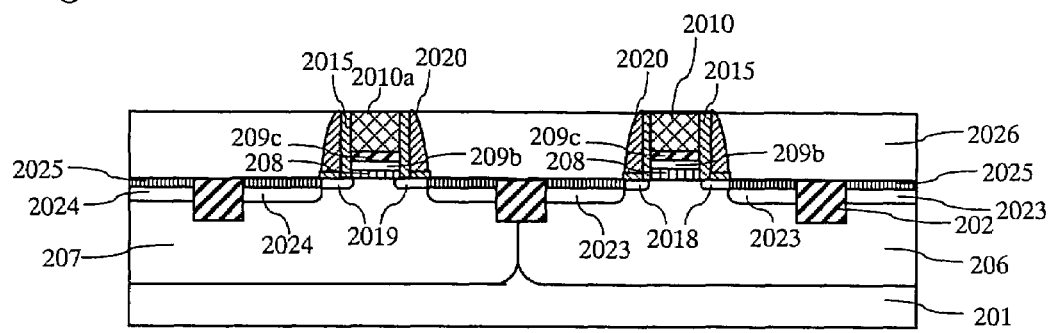
FIGS. 25A to 25C are cross-sectional views illustrating a method for manufacturing a semiconductor device according to the third embodiment.
Figure 25B:
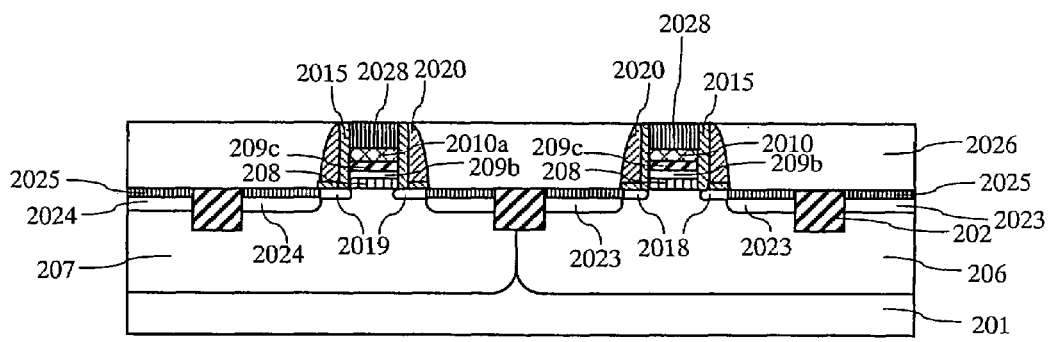

First, after forming the structure shown in FIG. 25A, a nickel film (not shown) acting as a first metal film and a titanium nitride film (not shown) are deposited on the entire surface. Then, a heat treatment is carried out, and the unreacted portions of the titanium nitride film and the nickel film are removed, forming as second metal silicide films the nickel silicide films 2028 on the surfaces of the n-type silicon film 2010*a* and the undoped silicon film 2010, as shown in FIG. 25B.

It should be noted that the rate of silicidation is higher on the silicon film (2010*a*) in which P has been implanted as an n-type impurity than on the undoped silicon film (2010). Therefore, the nickel silicide film 2028 in the n-type gate electrode portion is formed to have a larger thickness than the nickel silicide film 2028 in the p-type gate electrode portion. However, since the present embodiment forms the silicon film 2010 such that its film thickness is 2 to 3 times the thickness of the nickel silicide films 2028, in the n-type gate electrode portion the silicon nitride film 209*c* still can be in contact with the n-type silicon film 2010*a* even after the nickel silicide film 2028 is formed. (In the n-type gate electrode portion, some of the n-type silicon film 2010*a* remains even after the nickel silicide film 2028 is formed.)

Further, according to the present embodiment, the n-type impurities diffuse within the n-type silicon film 2010*a* due to the heat treatment carried out to form the nickel silicide films 2028. This prevents the gate electrode from being depleted and increases the inversion capacitance, allowing the on-current to be increased. It should be noted that As (arsenic) may be used as the n-type impurity, instead of P. However, P is more effective than As in activating the silicon film since P diffuses at a higher rate.

It should be noted that as shown in FIG. 25A, the nickel silicide film 2025 is formed on the surfaces of the source/drain diffusion layers 2023 and 2024 after forming the sidewalls of the gate electrodes. According to the present embodiment, the structure as shown in FIG. 25B may also be formed as follows. The hard mask (corresponding to the silicon oxide film 13 shown in FIGS. 6 to 8) used to process the gate electrodes is removed beforehand; a nickel silicide film 2028 is formed on the surface of each gate electrode when the nickel silicide film 2025 is formed on the source/drain diffusion layers 2023 and 2024; and the first interlayer insulating film 2026 is formed and processed by a CMP technique such that the nickel silicide film 2028 on the surface of each gate electrode is exposed.

Figure 25C:
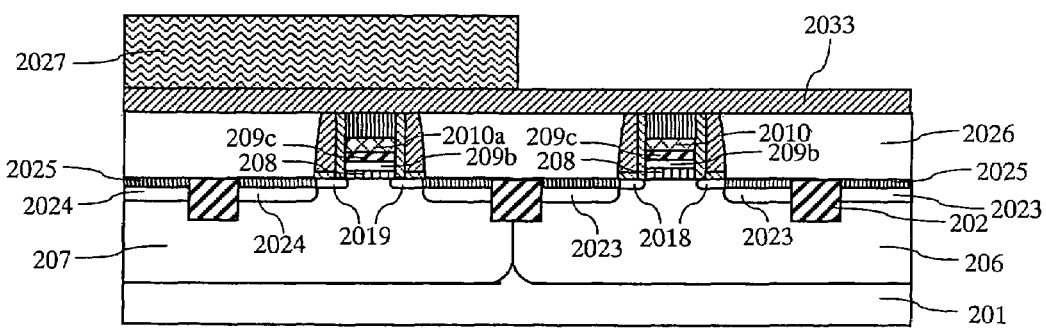
Figure 26A:
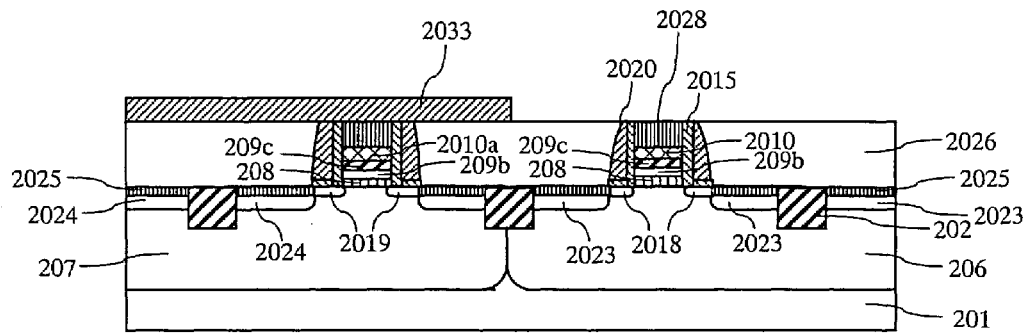
FIGS. 26A to 26C are other cross-sectional views illustrating the method for manufacturing the semiconductor device according to the third embodiment.

Then, a silicon nitride film 2033 is deposited on the entire surface, as shown in FIG. 25C, and processed using a resist 2027 as a mask, leaving the silicon nitride film 2033 only on the n-type gate dielectric film region, as shown in FIG. 26A. (The remaining silicon nitride film 2033 is used as a hard mask.)

Figure 26B:
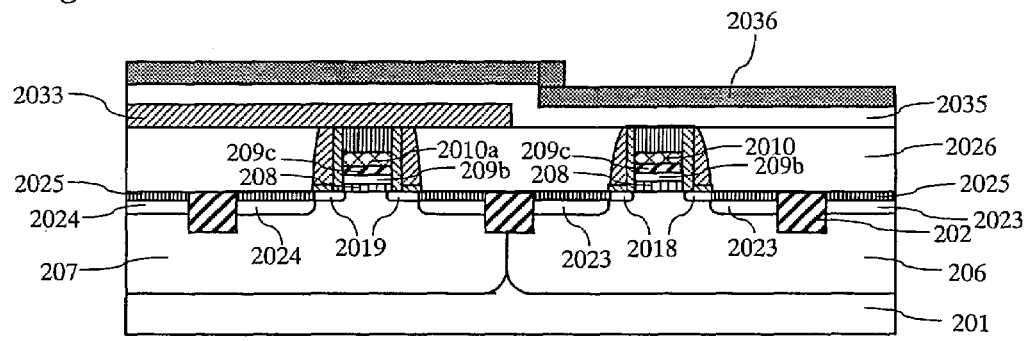
Figure 26C:
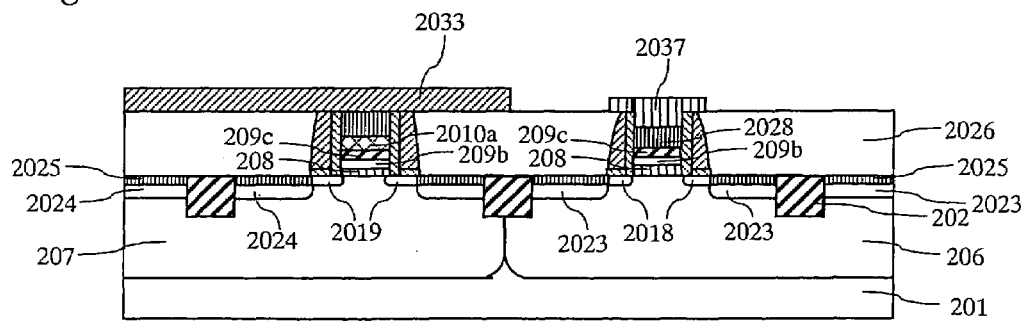

Then, a titanium film 2035 acting as a second metal film and a titanium nitride film 2036 are sequentially deposited on the entire surface, as shown in FIG. 26B. After that, a heat treatment is carried out at 540° C., causing nickel within the nickel silicide film 2028 (in the p-type gate electrode portion) to diffuse into the silicon film 2010 constituting the dummy gate electrode. At that time, silicon within the nickel silicide film 2028 diffuses into the titanium film 2035 on the nickel silicide film 2028. The time it takes for this reaction to complete depends on the film thickness of the silicon film 2010. For example, if the film thickness of the titanium film 2035 is one-half of the film thickness of the silicon film 2010, then the reaction eventually leads to formation of a nickel silicide film 2028 on the silicon nitride film 209c and formation of the titanium silicide film 2037 (acting as a third metal silicide film) on the nickel silicide film 2028 (in the p-type gate electrode portion). That is, it appears as if the nickel silicide film 2028 has replaced the lower portion of the silicon film 2010 and the remaining silicon film 2010 has reacted with the titanium film 2035 thereon. After that, the titanium nitride film 2036 and the unreacted portion of the titanium film 2035 are etched off, producing the structure shown in FIG. 26C.

Subsequently, the silicon nitride film 2033 used as the hard mask is removed by reactive ion etching or using hot phosphorusic acid, etc. Then, a second interlayer insulating film 2029 is deposited by a CVD technique or a coating technique, and its surface is planarized by a CMP technique, producing the structure shown in FIG. 18. After the planarization process, contacts, wiring, etc. are formed.

Figure 27A:
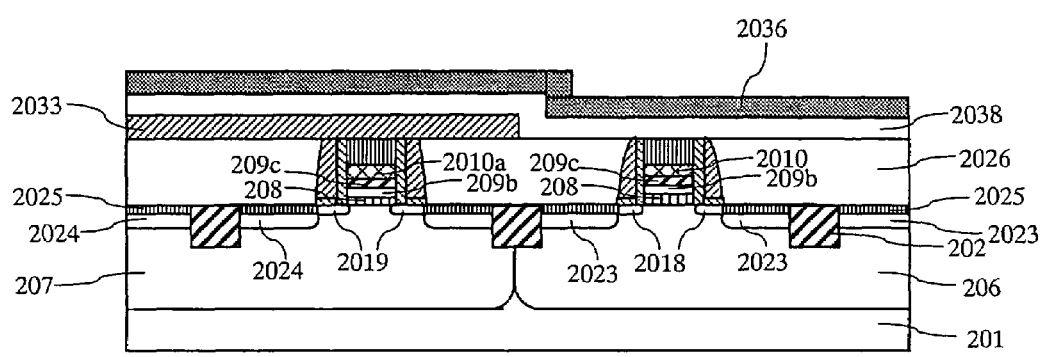
FIGS. 27A and 27B are cross-sectional views illustrating another method for manufacturing a semiconductor device according to the third embodiment.
Figure 27B:
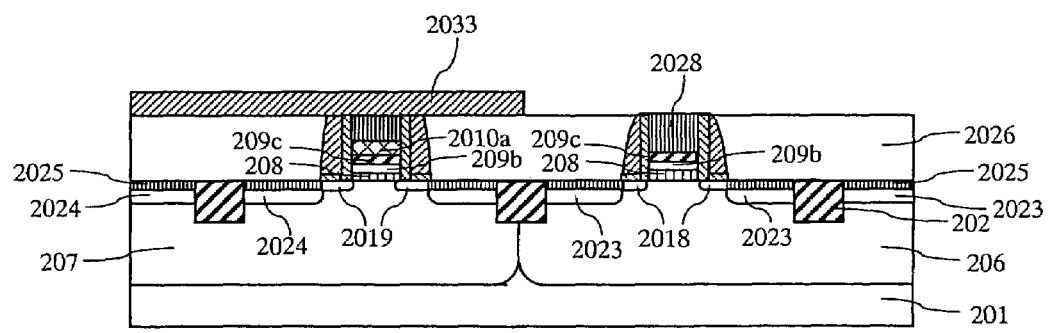
Figure 28A:
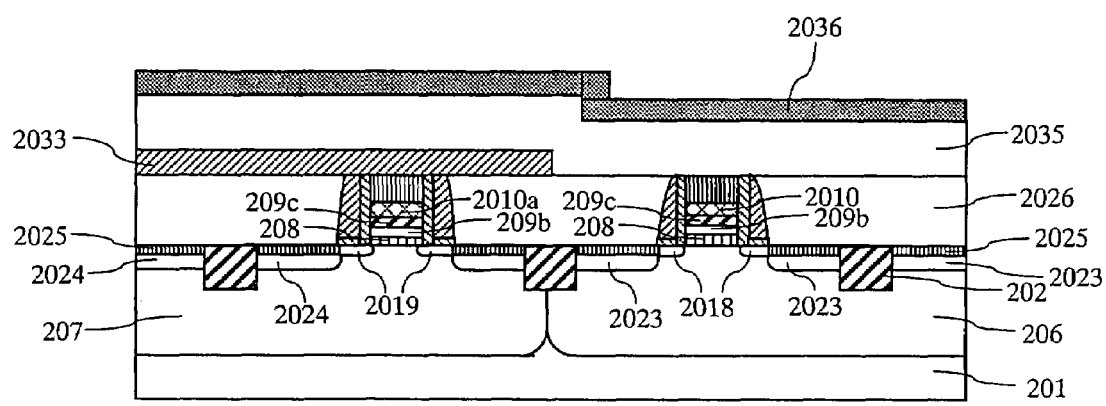
FIGS. 28A and 28B are cross-sectional views illustrating yet another method for manufacturing a semiconductor device according to the third embodiment.
Figure 28B:
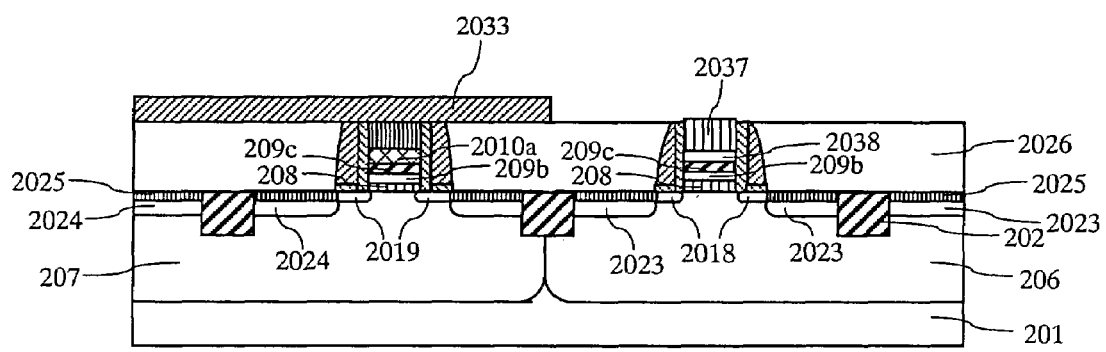

Alternatively, before performing the above process for replacing (a portion of) the silicon film 2010 with the nickel silicide film 2028 (in the p-type gate electrode portion), a thick nickel film (first metal film) 2038 and the titanium nitride film 2036 may be formed on the entire surface, as shown in FIG. 27A. This allows the p-type gate electrode to be entirely formed of the nickel silicide film (second metal silicide film) 2028. After that, the titanium nitride film 2036 and the unreacted portion of the nickel film 2038 are removed, producing the structure shown in FIG. 27B. Subsequently, the silicon nitride film 2033 is removed by reactive ion etching or using hot phosphorusic acid, etc. Then, the second interlayer insulating film 2029 is deposited by a CVD technique or a coating technique and planarized by a CMP technique, producing the structure shown in FIG. 19. After the planarization process, contacts, wiring, etc. are formed, as in the above process.

Alternatively, instead of performing the above process for replacing (a portion of) the silicon film 2010 with the nickel silicide film 2028, a thick titanium film (second metal film) 2035 may be formed on the entire surface, and a heat treatment is carried out at 540° C. for one hour. As a result, (in the p-type gate electrode portion) the nickel silicide film 2028 replaces the silicon film 2010 and silicon within the nickel silicide 2028 diffuses into the titanium film 2035, which eventually leads to a structure in which the nickel film (first metal film) 2038 is in contact with the silicon nitride film 209c and the titanium silicide film (third metal silicide film) 2037 is formed on the nickel film 2038. It should be noted that this structure can be obtained when the film thickness of the titanium film 2035 is larger than the sum of the film thicknesses of the nickel silicide film 2028 and the silicon film 2010. After that, the titanium nitride film 2036 and the unreacted portion of the titanium film 2035 are removed, producing the structure shown in FIG. 28B.

Subsequently, the silicon nitride film 2033 is removed by reactive ion etching or using hot phosphorusic acid, etc. Then, the second interlayer insulating film 2029 is deposited by a CVD technique or a coating technique and planarized by a CMP technique, producing the structure shown in FIG. 20. After that, contacts, wiring, etc. are formed, as in the above process.

In the above examples, the nickel silicide film 2028 or the nickel film 2038 is in contact with the silicon nitride film 209c. On the other hand, if the titanium film 2035 is formed on the entire surface such that its film thickness is larger than the film thickness of the silicon film 2010 and smaller than the sum of the film thicknesses of the nickel silicide film 2028 and the dummy silicon film 2010, then the titanium silicide film 2037 is formed on a laminated structure consisting of the nickel film 2038 and the nickel silicide film 2028.

It should be noted that the structures shown in FIGS. 22 to 24 are obtained in the following manner (as in the second embodiment). The titanium silicide films 2032 and 2037 are etched off using dilute hydrofluoric acid, etc. After that, the titanium nitride film 2030 and the tungsten film 2031 are deposited and processed by a CMP technique such that they are left only in the recesses of the gate electrode portions. Then, the second interlayer insulating film 2029 is deposited and planarized by a CMP technique, producing the structures shown in FIGS. 22 to 24. Alternatively, the titanium nitride film 2030 and the tungsten film 2031 may be sequentially formed and processed by reactive ion etching, etc. using a mask, etc. such that these films are left only in the recesses of the gate electrode portions. After that, the second interlayer insulating film 2029 may be deposited and planarized by a CMP technique, producing a structure (not shown) similar to that shown in FIG. 3 described in connection with the first embodiment.

The present embodiment is different from the second embodiment in that the silicon film 2010 constituting the dummy p-type gate electrode is not reduced in film thickness. That is, the present embodiment is characterized in that after forming the nickel silicide film 2028 on the silicon film 2010 (in the p-type gate electrode portion) as in the n-type gate electrode portion, the gate electrode portions are processed by a silicon replacement technique such that only the p-type gate electrode portion has a structure in which the nickel silicide film 2028 or the nickel film 2038 is in contact with the silicon nitride film 209c (which is the gate dielectric film).

It should be noted that even though the present embodiment replaces the silicon film 2010 constituting the dummy electrode by the nickel silicide film 2028, the present invention is not limited to this particular type of metal silicide film. Instead of the nickel silicide film, it is possible to use any metal silicide film which provides a metal element as a diffusing species during silicide formation. Examples of such metal silicide films include platinum silicide films, palladium silicide films, and cobalt silicide films. However, ruthenium silicide is not suitable for this purpose since it has high resistivity.

Further, though the present embodiment has been described as using the silicon oxide films 208 as the underlying interface layers, silicon oxynitride films (as in the second embodiment) or silicon nitride films may be used instead of the silicon oxide film 208.

Figure 29A:
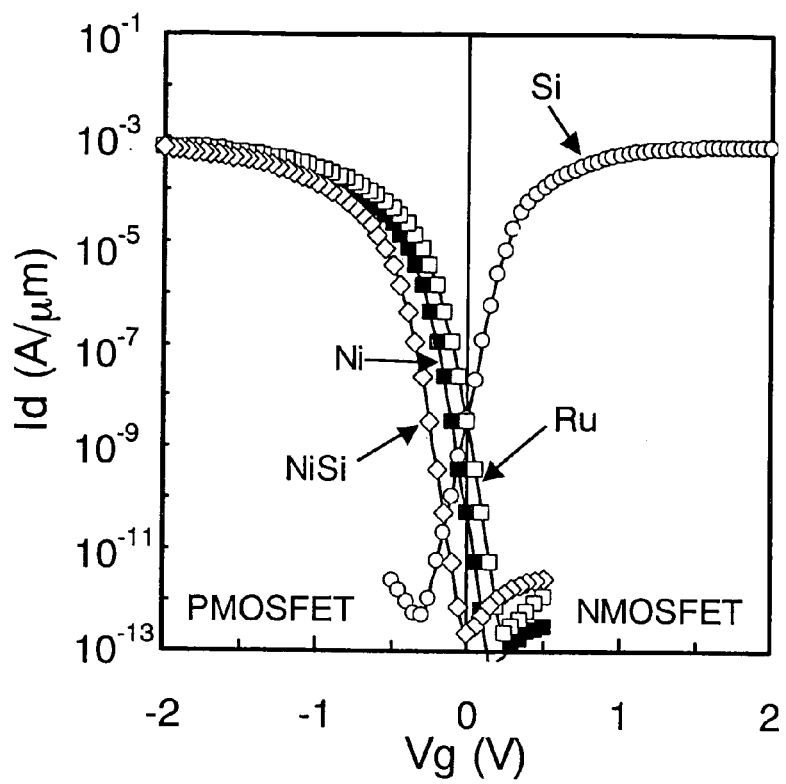
FIG. 29A is a diagram showing the subthreshold characteristics of transistors of the present invention.
Figure 29B:
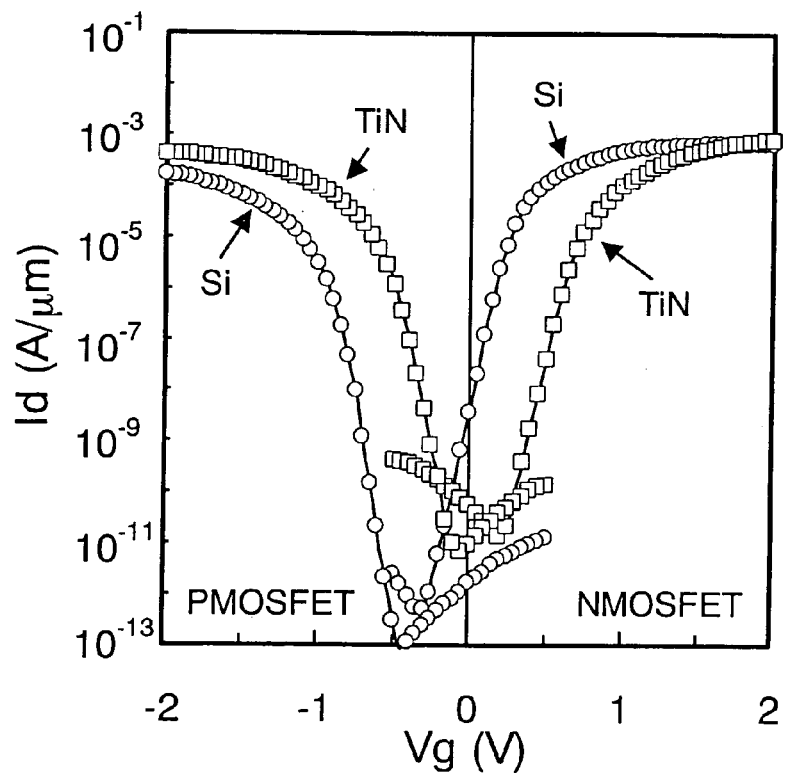
FIG. 29B is a diagram showing the subthreshold characteristics of conventional transistors for comparison.
Figure 30A:
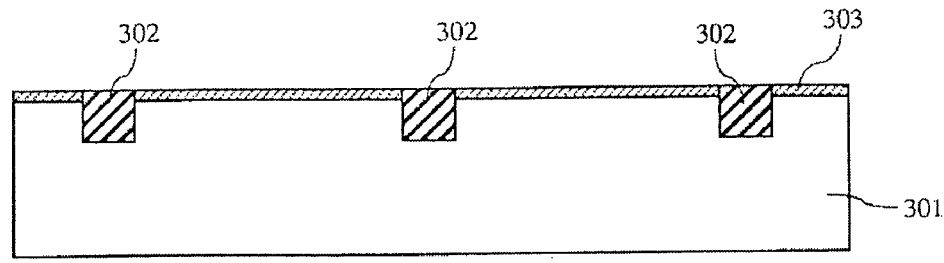
FIGS. 30A to 30C are cross-sectional views illustrating a conventional method for manufacturing a semiconductor device.
Figure 30B:
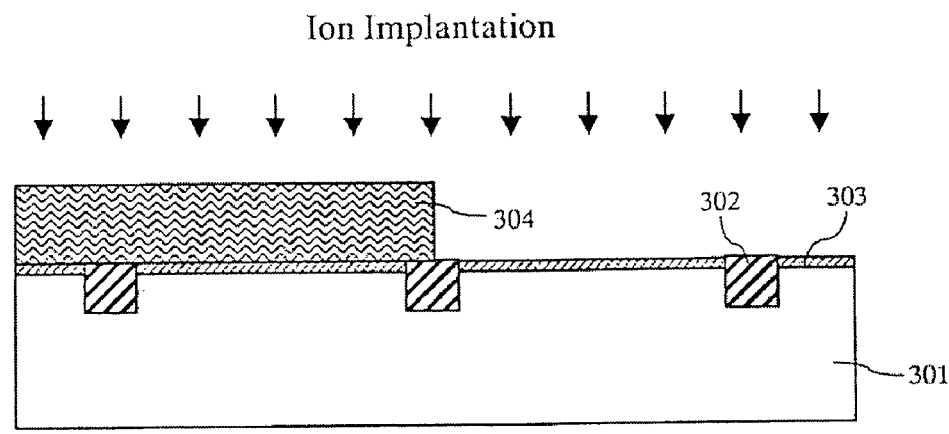
Figure 30C:
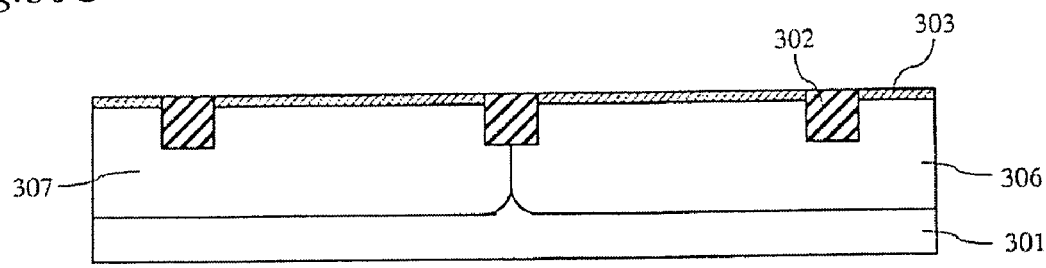
Figure 31A:
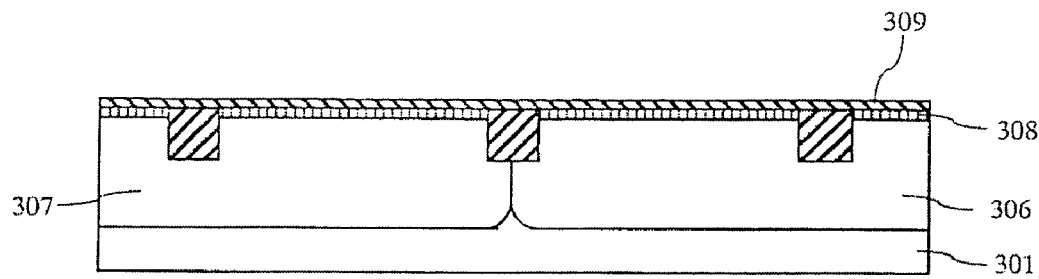
FIGS. 31A to 31C are other cross-sectional views illustrating the conventional method for manufacturing the semiconductor device.
Figure 31B:
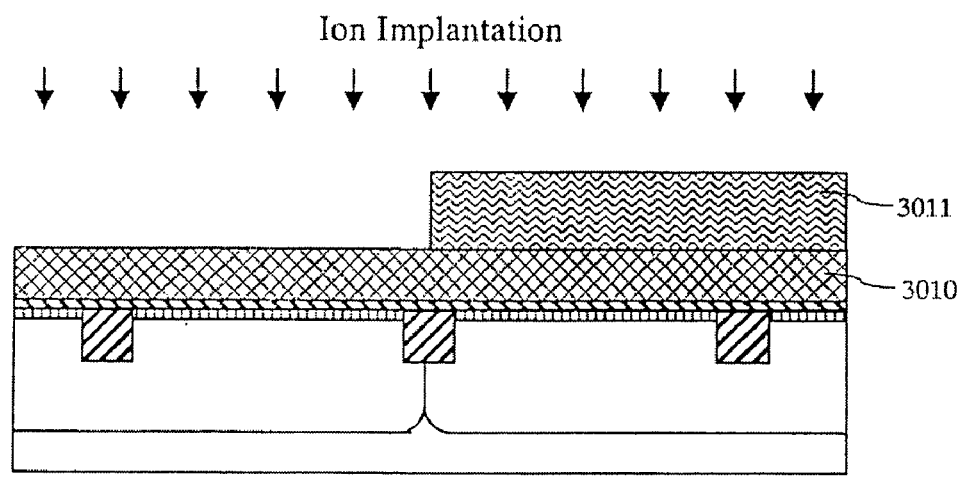
Figure 31C:
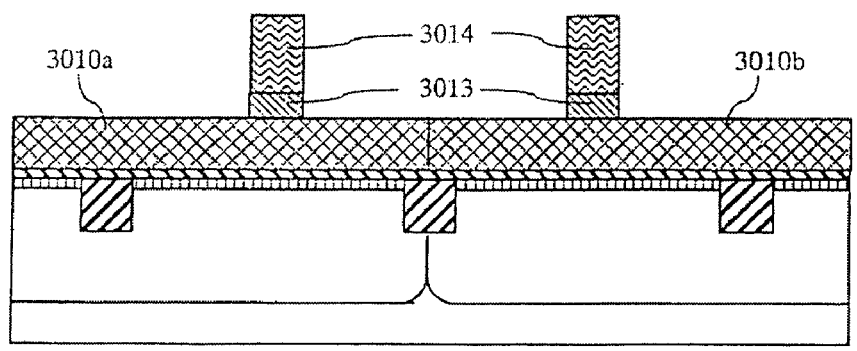
Figure 32A:
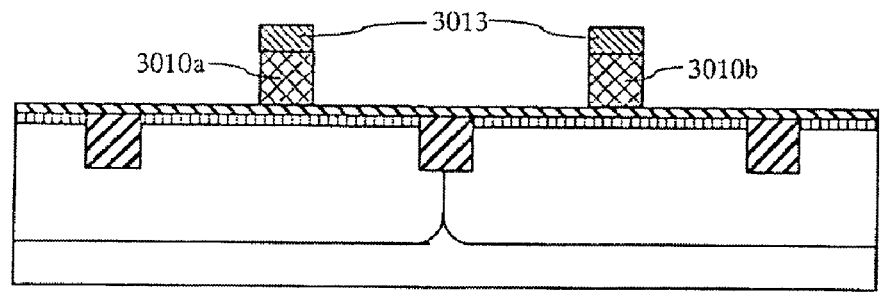
FIGS. 32A to 32C are yet other cross-sectional views illustrating the conventional method for manufacturing the semiconductor device.
Figure 32B:
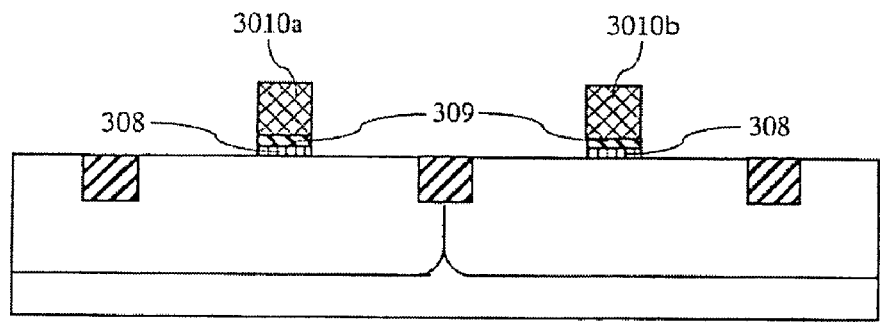
Figure 32C:
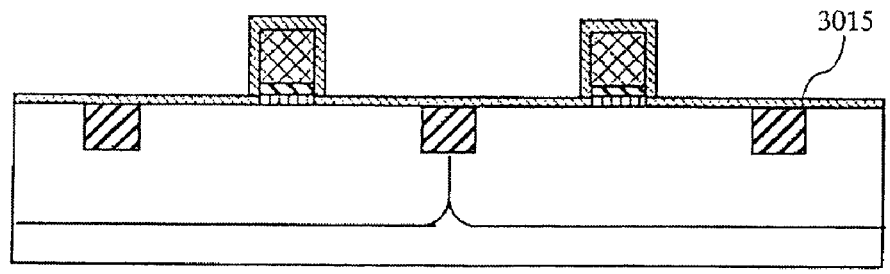
Figure 33A:
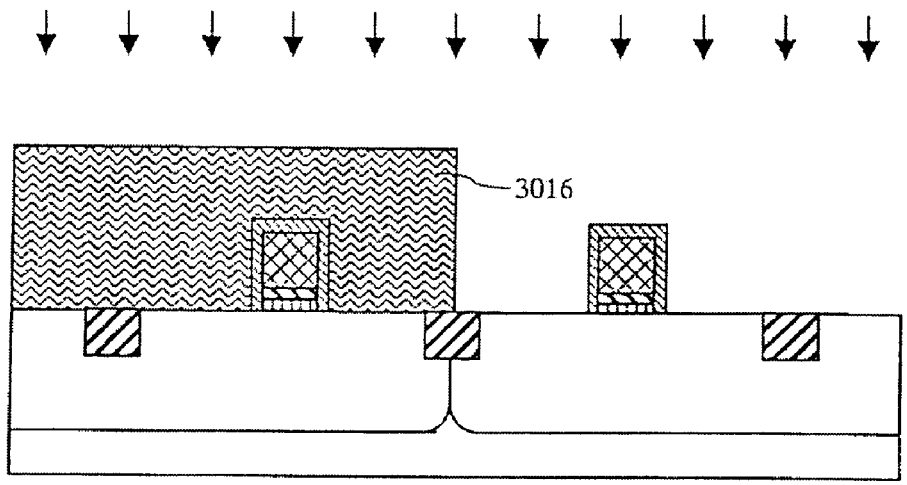
FIGS. 33A to 33C are still other cross-sectional views illustrating the conventional method for manufacturing the semiconductor device.
Figure 33B:
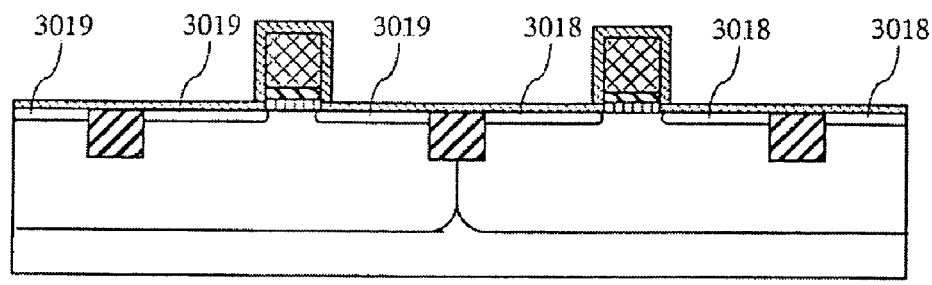
Figure 33C:
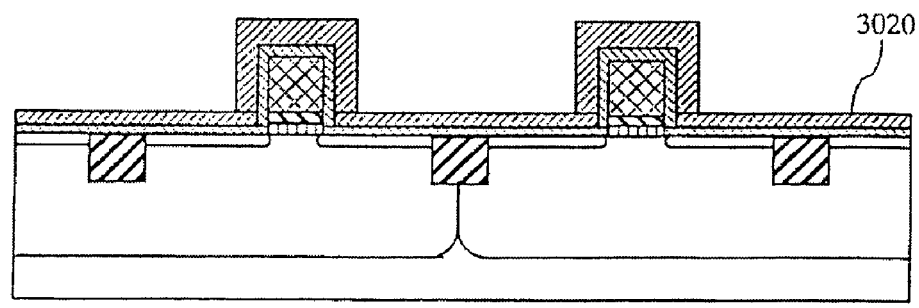

FIG. 29A shows the subthreshold characteristics of transistors (CMOSFETs) with a gate length of 40 nm formed according to the present invention. FIG. 29B, on the other hand, shows the subthreshold characteristics of conventional CMOSFETs (comparative examples 1 and 2) for comparison. Comparative example 1 uses silicon gate electrodes, while comparative example 2 uses titanium nitride electrodes. In each sample, each gate dielectric film is made up of a silicon oxide film with a film thickness of 0.5 nm and a hafnium silicon oxynitride film with a film thickness of 2 nm and formed on a channel in which no impurities have been ion-implanted to adjust the threshold voltage.

In the case of comparative example 1, the threshold voltage of the PMOSFET has been considerably shifted toward the negative side while the threshold voltage of the NMOSFET is small, as shown in FIG. 29B. In the case of comparative example 2, the threshold voltage of the NMOS- FET has been shifted toward the positive side while the absolute value of the threshold voltage of the PMOSFET is relatively small.

As for each sample of the present invention, even though the subthreshold characteristic of the NMOSFET using an n-type silicon electrode is the same as that of comparative example 1, the subthreshold characteristic of the PMOSFET is symmetrical to that of the NMOSFET, as shown in FIG. 29A. The threshold voltage (of the PMOSFET) slightly changes depending on the type of material of which the gate electrode is made. However, such changes can be accommodated by changing the channel dose amount, since they are small.

FIG. 29A shows that the PMOSFET of each sample of the present invention exhibits a sufficiently large current value, as compared to comparative example 1. This means that the present invention can optimize the threshold voltage of the PMOSFET as well as preventing the gate electrode from being depleted.

The above experimental results show that the present invention is very effective when a high dielectric constant insulating film is used as a gate dielectric film. It should be noted that the present invention is not limited to the embodiments described above, and various alterations may be made thereto without departing from the spirit and scope of the invention.

The features and advantages of the present invention may be summarized as follows.

As described above, the present invention provides a semiconductor device configured such that: the gate electrode of the NMOSFET is made up of an n-type silicon film formed on the gate dielectric film and a first metal silicide film formed on the n-type silicon film; and the gate electrode of the PMOSFET is made up of a second metal silicide film formed on the gate dielectric film. This arrangement makes it possible to optimize the threshold voltages of the NMOSFET and the PMOSFET as well as increasing the inversion capacitances. Furthermore, since the high dielectric constant insulating films are not formed on the sidewalls of the gate electrodes of the NMOSFET and the PMOSFET, the off-currents can be sufficiently reduced.

Further, another aspect of the present invention provides a semiconductor device configured such that: the gate electrode of the NMOSFET is made up of an n-type silicon film formed on the gate dielectric film and a first metal silicide film formed on the n-type silicon film; and the electrode of the PMOSFET has a laminated structure made up of a metal film formed on the gate dielectric film and a second metal silicide film formed on the metal film. This arrangement also makes it possible to optimize the threshold voltages of the NMOSFET and the PMOSFET as well as increasing the inversion capacitances.

Further, in accordance with still another aspect of the present invention, the high dielectric constant films are formed before forming the gate electrodes. Such an arrangement removes the restriction that the heat treatment temperature must be determined by taking into account the heat resistance of the silicide. This allows the heat treatment to be carried out at a desired temperature, resulting in high-quality gate dielectric films.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2004-071138, filed on Mar. 12, 2004 including specification, claims, drawings and summary, on which the Convention priority of the present application is based, are incorporated herein by reference in its entirety.

What is claimed is:

1. A semiconductor device comprising:
   a silicon substrate; and
   a CMOSFET on said silicon substrate and including an NMOSFET and a PMOSFET, wherein
   a gate dielectric film of said NMOSFET and a gate dielectric film of said PMOSFET each have a laminated structure including a first dielectric film and a second dielectric film, said first dielectric film being on said silicon substrate, and said second dielectric film being on said first dielectric film;
   a gate electrode of said NMOSFET includes an n-type silicon film and a first metal silicide film, said n-type silicon film being on said gate dielectric film of said NMOSFET and being in contact with said gate dielectric film of said NMOSFET, and said first metal silicide film being on said n-type silicon film;
   a gate electrode of said PMOSFET includes a second metal silicide film directly in contact with said gate dielectric film of said PMOSFET; and
   said second dielectric film is a high dielectric constant dielectric film and is not on sidewalls of said gate electrodes of said NMOSFET and said PMOSFET.

2. The semiconductor device as claimed in claim 1, wherein said first metal silicide film is one of a single-layer film and a multilayer film including at least two films, said single-layer film and said at least two films each including a material selected from a group consisting of nickel silicide, cobalt silicide, palladium silicide, rhodium silicide, ruthenium silicide, platinum silicide, and iridium silicide.

3. The semiconductor device as claimed in claim 1, wherein said second metal silicide film is one of a single-layer film and a multilayer film including at least two films, said single-layer film and said at least two films each including a material selected from a group consisting of nickel silicide, cobalt silicide, palladium silicide, rhodium silicide, ruthenium silicide, platinum silicide, and iridium silicide.

4. The semiconductor device as claimed in claim 1, wherein said high dielectric constant dielectric film includes a material selected from a group consisting of silicate nitrides, silicates, and oxides, said silicate nitrides, said silicates, and said oxides containing at least one of hafnium and zirconium.

5. The semiconductor device as claimed in claim 1, wherein said first dielectric film includes a material selected from a group consisting of silicon oxide, silicon nitride, and silicon oxynitride.

6. The semiconductor device as claimed in claim 1, comprising a third dielectric film formed on said high dielectric constant dielectric film.

7. The semiconductor device as claimed in claim 6, wherein said third dielectric film includes a material selected from a group consisting of silicon oxide, silicon nitride, and silicon oxynitride.

* * * * *